US011856681B2

(12) United States Patent
Vaschenko et al.

(10) Patent No.: US 11,856,681 B2
(45) Date of Patent: Dec. 26, 2023

(54) TARGET DELIVERY SYSTEM

(71) Applicant: ASML Netherlands B.V., Veldhoven (NL)

(72) Inventors: Georgiy Olegovich Vaschenko, San Diego, CA (US); Bob Rollinger, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 275 days.

(21) Appl. No.: 17/421,055

(22) PCT Filed: Jan. 9, 2020

(86) PCT No.: PCT/EP2020/050411
§ 371 (c)(1),
(2) Date: Jul. 7, 2021

(87) PCT Pub. No.: WO2020/148155
PCT Pub. Date: Jul. 23, 2020

(65) Prior Publication Data
US 2022/0061144 A1   Feb. 24, 2022

Related U.S. Application Data

(60) Provisional application No. 62/913,552, filed on Oct. 10, 2019, provisional application No. 62/793,813, filed on Jan. 17, 2019.

(51) Int. Cl.
*H05G 2/00* (2006.01)
*G03F 7/00* (2006.01)

(52) U.S. Cl.
CPC ........ *H05G 2/006* (2013.01); *G03F 7/70033* (2013.01); *H05G 2/008* (2013.01)

(58) Field of Classification Search
CPC ..... H05G 2/006; H05G 2/008; G03F 7/70033
See application file for complete search history.

(56) References Cited

U.S. PATENT DOCUMENTS

| 2018/0341180 A1 | 11/2018 | Shiraishi et al. |
| 2018/0368242 A1* | 12/2018 | Winkels ................. H05G 2/008 |

(Continued)

FOREIGN PATENT DOCUMENTS

| WO | 2016059674 A1 | 4/2016 |
| WO | 2017121573 A1 | 7/2017 |
| WO | 2018042627 A1 | 3/2018 |

OTHER PUBLICATIONS

Christopher Smith, European Patent Office International Searching Authority, International Search Report and Written Opinion, corresponding PCT Application No. PCT/EP2020/050411, dated Jun. 24, 2020, 14 pages total.

(Continued)

*Primary Examiner* — Nicole M Ippolito
*Assistant Examiner* — Hanway Chang
(74) *Attorney, Agent, or Firm* — DiBerardino McGovern IP Group LLC

(57) ABSTRACT

A target delivery system for an extreme ultraviolet (EUV) light source is disclosed. The system includes: a conduit including an orifice configured to fluidly couple to a reservoir; an actuator configured to mechanically couple to the conduit such that motion of the actuator is transferred to the conduit; and a control system coupled to the actuator, the control system being configured to: determine an indication of pressure applied to target material in the reservoir, and control the motion of the actuator based on the determined indication of applied pressure. Moreover, techniques for operating a supply system are disclosed. For example, one or more characteristics of the supply system are determined, and an actuator that is mechanically coupled to the supply (Continued)

system is controlled based on the one or more determined characteristics such that an orifice of the supply system remains substantially free of material damage during operational use.

27 Claims, 11 Drawing Sheets

(56) References Cited

U.S. PATENT DOCUMENTS

2019/0155163 A1 5/2019 Shiraishi et al.
2019/0200443 A1 6/2019 Nakano

OTHER PUBLICATIONS

D.G. Eskin et al., "Fundamental Studies of Ultrasonic Melt Process," Proceedings of the 6th Decennial International Conference on Solidification Processing, Old Windsor, Jul. 2017.
G.I. Eskin, Ultrasonic Treatment of Light Alloy Melts, CRC Press (Taylor & Francis Group, Boca Raton, FL), reprint 2018, first published 1998.
I. Tzanakis et al., "Investigation of the factors influencing cavitation intensity during the ultrasonic treatment of molten aluminium," Materials and Design, vol. 90, pp. 979-983, 2016.

\* cited by examiner

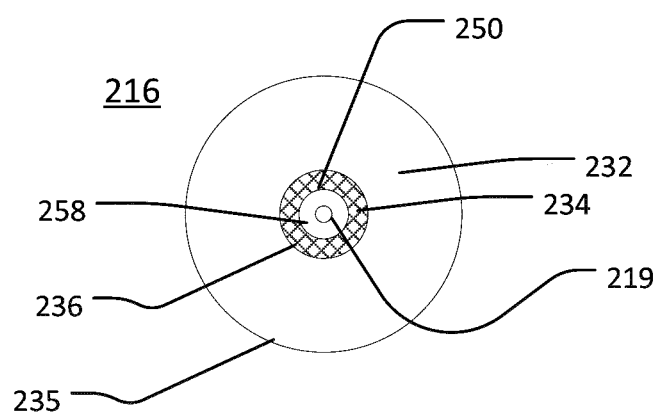
FIG. 2B
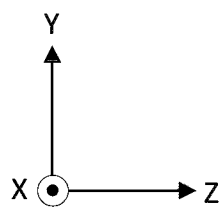

600

```
┌─────────────────────────────┐
│ Determine one or more       │
│ characteristics             │
│ of a supply system          │
│                             │
│ 610                         │
└─────────────────────────────┘
              │
              ▼
┌─────────────────────────────┐
│ Control an actuator that is │
│ mechanically                │
│ coupled to the supply system│
│ based on                    │
│ the one or more determined  │
│ characteristics of the      │
│ supply system such          │
│ that an orifice of the      │
│ supply system               │
│ remains substantially free  │
│ of material                 │
│ damage                      │
│                             │
│ 620                         │
└─────────────────────────────┘
```

FIG. 6

TARGET DELIVERY SYSTEM

CROSS REFERENCE TO RELATED APPLICATION

This application claims priority to U.S. Application No. 62/793,813, filed Jan. 17, 2019 and titled Target Delivery System, and U.S. Application No. 62/913,552 filed Oct. 10, 2019 and titled Target Delivery System, both of which are incorporated herein in their entireties by reference.

TECHNICAL FIELD

This disclosure relates to a target delivery system for an extreme ultraviolet (EUV) light source.

BACKGROUND

Extreme ultraviolet ("EUV") light, for example, electromagnetic radiation having wavelengths of 100 nanometers (nm) or less (also sometimes referred to as soft x-rays), and including light at a wavelength of, for example, 20 nm or less, between 5 and 20 nm, or between 13 and 14 nm, may be used in photolithography processes to produce extremely small features in substrates, for example, silicon wafers, by initiating polymerization in a resist layer.

Methods to produce EUV light include, but are not necessarily limited to, converting a material that includes an element, for example, xenon, lithium, or tin, with an emission line in the EUV range in a plasma state. In one such method, often termed laser produced plasma ("LPP"), the required plasma may be produced by irradiating a target material, for example, in the form of a droplet, plate, tape, stream, or cluster of material, with an amplified light beam that may be referred to as a drive laser. For this process, the plasma is typically produced in a sealed vessel, for example, a vacuum chamber, and monitored using various types of metrology equipment.

SUMMARY

In one aspect, a target delivery system for an extreme ultraviolet (EUV) light source includes: a conduit including an orifice configured to fluidly couple to a reservoir; an actuator configured to mechanically couple to the conduit such that motion of the actuator is transferred to the conduit; and a control system coupled to the actuator, the control system being configured to: determine indication of pressure applied to target material in the reservoir, and control the motion of the actuator based on the determined indication of applied pressure.

Implementations may include one or more of the following features. The control system may be further configured to compare the determined indication of applied pressure to a threshold value, and the control system being configured to control the motion of the actuator based on the determined indication of applied pressure may include the control system being configured to control the motion of the actuator based on the comparison. The motion of the actuator may produce a displacement in a wall of the conduit and an acoustic wave inside the conduit, and the threshold value may be related to an amplitude of the acoustic wave. The control system being configured to control the actuator based on the comparison may include the control system being configured to only cause the actuator to produce displacement in the conduit wall if the determined indication of applied pressure is greater than the threshold value. The threshold value may be a threshold pressure between zero and an operating pressure, and the operating pressure may be an amount of pressure that is applied to the target material in the reservoir during operation of the EUV light source. The acoustic wave may include a maximum amplitude, and the threshold value may be defined by the maximum amplitude. The threshold value may be a threshold pressure in a range of 200 to 1000 pounds per square inch (PSI). The control system also may include one or more electronic processors, and a non-transient computer-readable storage medium coupled to the one or more electronic processors.

In some implementations, the control system being configured to control the motion of the actuator based on the determined indication of applied pressure includes the control system being configured to provide modulation signals to the actuator based on the determined indication of applied pressure, the modulation signals being sufficient to cause the actuator to produce displacement in a wall of the conduit. The actuator may include a piezo-electric modulator, and the modulation signals may include electrical signals sufficient to cause a shape of the piezo-electric modulator to change.

The control system also may include an electrical switch configured to be coupled to the actuator, and wherein the electrical switch is configured to receive the indication of the applied pressure, the electrical switch is configured to have a particular one of a plurality of possible states at a particular time, the electrical switch allows modulation signals to reach the actuator in fewer than all of the plurality of states, the particular state of the electrical switch at the particular time is determined by the received indication of the applied pressure, and the control system being configured to determine the indication of applied pressure includes determining that the electrical switch is in the particular state. The indication of the applied pressure may be received from a separate pressure switch that is coupled to the reservoir. The received indication of the applied pressure may include an analog signal received directly from a pressure sensor. The received indication of the applied pressure may include an electronic signal generated by instructions executed by an electronic processor.

In some implementations, an interior surface of the conduit is configured to be exposed to the target material, and the interior surface is substantially defect-free to thereby reduce cavitation in the target material. At least a portion of the interior surface may be firepolished.

The control system being configured to determine an indication of pressure applied to the target material may include the control system being configured to analyze an indication from a pressure sensor configured to measure the applied pressure.

In another aspect, a target delivery system for an extreme ultraviolet (EUV) light source includes: a conduit including an orifice configured to fluidly couple to a reservoir; an actuator configured to mechanically couple to the conduit such that motion of the actuator is transferred to the conduit; a signal generator configured to provide modulation signals to the actuator, the modulation signals being sufficient to cause the actuator to move; and a control system coupled to the actuator and the signal generator, the control system being configured to: control one or more characteristics of the modulation signals to thereby control one or more characteristics of a motion of the actuator such that, in use, the orifice remains substantially free of material damage.

Implementations may include one or more of the following features. The one or more characteristics may include a frequency content of the modulation signals, and the control system may be configured to control the frequency content of the modulation signals. The control system may be configured to reduce an amplitude of components of the modulation signal that have a frequency below a frequency threshold. The mechanically coupled actuator and conduit may form an actuator-conduit assembly, and the control system may be configured to reduce an amplitude of components of the modulation signal that are at a frequency associated with eigenmodes of the actuator-conduit assembly or its harmonics and sub-harmonics.

The one or more characteristics may include an amplitude of the modulation signals, and the control system is configured to control the amplitude of the modulation signals. The control system may be configured to maintain the amplitude of the modulation signals to below an amplitude limit. The amplitude limit may be a peak-to-peak amplitude limit.

The orifice may remain substantially free of cracks.

The orifice may be defined by an end of the conduit.

The conduit may be coupled to a structure that defines the orifice.

In another aspect, a target delivery system for an extreme ultraviolet (EUV) light source includes: a reservoir configured to hold a mixture, the mixture including target material and inclusion particles; a conduit including an orifice configured to fluidly couple to the reservoir; an actuator configured to mechanically couple to the reservoir such that motion of the actuator is transferred to the reservoir; and a control system coupled to the actuator, the control system being configured to: control the motion of the actuator to thereby cause the inclusion particles in the mixture to move toward a surface of the mixture.

Implementations may include one or more of the following features. The actuator may be an ultrasonic actuator. The target delivery system also may include a gas delivery system configured to deliver a flowing gas across the surface of the mixture. The flowing gas may include at least one component configured to react with the inclusion particles to thereby remove at least some of the inclusion particles from the surface. The target material may include melted tin, the inclusion particles may include tin oxide particles, and the flowing gas may include hydrogen. The motion of the actuator may be controlled such that cavitation is induced in the mixture, and the inclusion particles are moved toward the surface by bubbles formed by the cavitation around the particles.

The target delivery system also may include one or more filters between the reservoir and the orifice, the filters being configured to substantially prevent the inclusion particles from reaching the orifice. The inclusion particles may have a diameter of 1 micrometer (μm) or less.

The inclusion particles may include tin oxide particles.

In another aspect, a method of operating a target supply system of an EUV light source includes: determining one or more characteristics of the supply system; and controlling an actuator that is mechanically coupled to the supply system based on the one or more determined characteristics such that an orifice of the supply system remains substantially free of material damage during operational use.

Implementations of any of the techniques described above may include an EUV light source, a target supply system, a method, a process, a device, or an apparatus. The details of one or more implementations are set forth in the accompanying drawings and the description below. Other features will be apparent from the description and drawings, and from the claims.

DRAWING DESCRIPTION

FIG. 2B is a top cross-sectional view of the target formation structure of FIG. 2A.

FIG. 6 is a flow chart of an example of a process for operating a supply system of an EUV light source.

DETAILED DESCRIPTION

Figure 1:
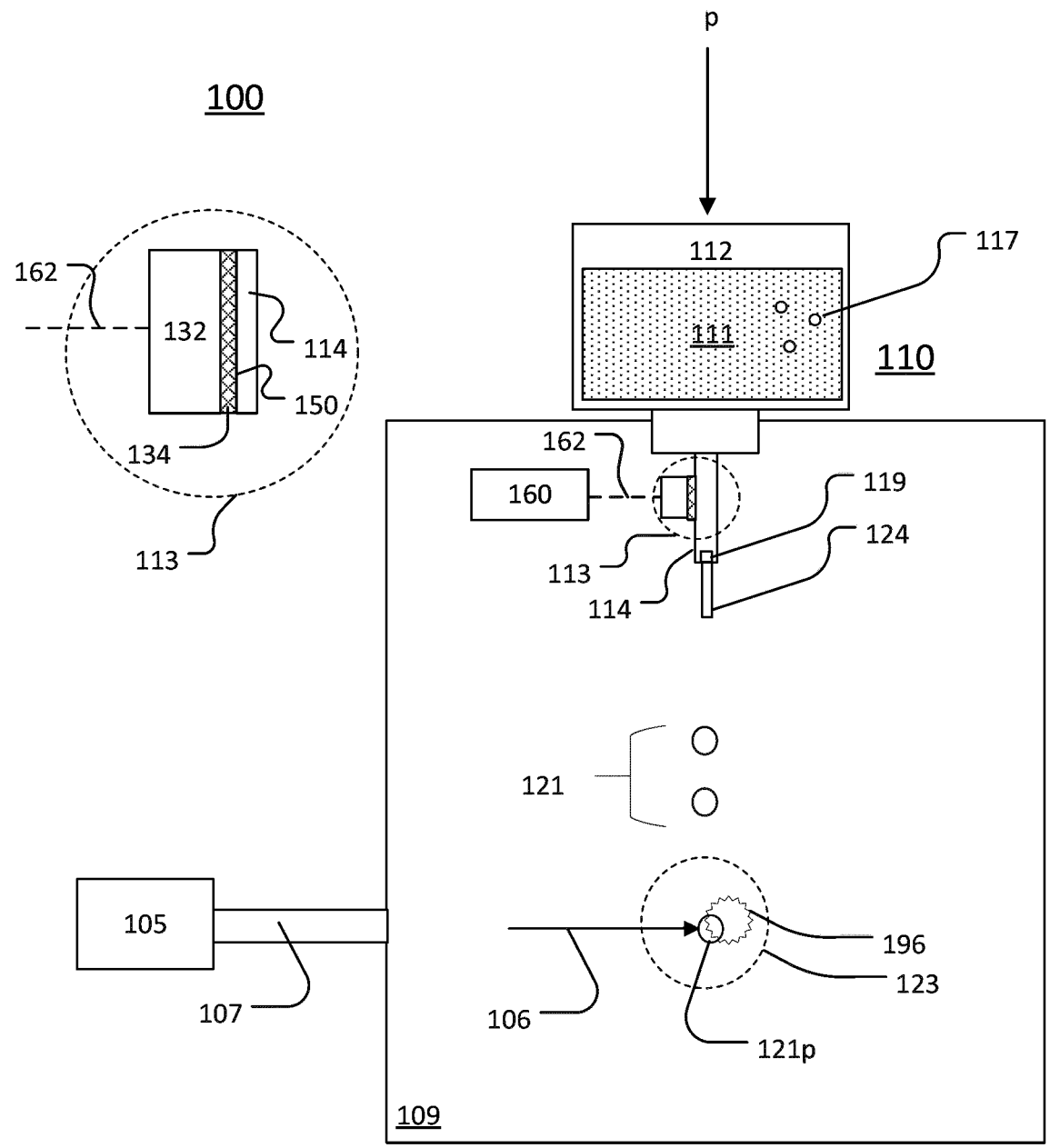
FIG. 1 is a block diagram of an example of an EUV light source that includes a supply system.

Referring to FIG. 1, a block diagram of an EUV light source 100 that includes a supply system 110 is shown. The supply system 110 emits a stream of targets 121 such that a target 121p is delivered to a plasma formation location 123 in a vacuum chamber 109. The target 121p includes target material, which is any material that emits EUV light when in a plasma state. For example, the target material may include tin, lithium, or xenon. The plasma formation location 123 receives a light beam 106. The light beam 106 is generated by an optical source 105 and delivered to the vacuum chamber 109 via an optical path 107. An interaction between the light beam 106 and the target material in the target 121p produces a plasma 196 that emits EUV light.

The supply system 110 may include a capillary tube 114 that has an orifice 119. The orifice 119 is at an end of the capillary tube 114 and the orifice 119 forms the outlet of the capillary tube 114. The capillary tube 114 may be made from, for example, glass in the form of fused silica or quartz. A region 113 (outlined by a dashed line in FIG. 1) that encompasses a portion of the capillary tube 114 is shown in greater detail in the inset. A sidewall 150 of the capillary tube 114 is mechanically coupled to an actuator 132 by an adhesive 134 (shown with cross-hatch shading in FIG. 1). The region 113 is not a physical structure within the vacuum chamber 109 but is instead used to label a portion of the supply system 110 that is shown in greater detail. The orifice 119 is fluidly coupled to a reservoir 112 that contains a target mixture 111 under pressure p. The target mixture 111 includes the target material, which is any material that has an emission line in the EUV range when in a plasma state. As discussed above, the target material may be, for example, tin, lithium, or xenon. Other materials may be used as the target material. For example, the element tin may be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. The target mixture may also include impurities such as non-target particles or inclusion particles 117. The inclusion particles 117 may be, for example, particles of tin oxide ($SnO_2$) or particles of tungsten (W).

The target mixture 111 is a liquid material that is able to flow in the capillary tube 114. For example, in implementations in which the target mixture 111 includes a metal (such as tin) that is solid at room temperature, the metal is melted and is in liquid form in the target mixture 111. Under certain conditions cavitation bubbles may form in the target mixture 111. The bubbles may cause damage to the capillary tube 114 and/or the orifice 119. Techniques for reducing or eliminating the formation of bubbles are discussed below. When the pressure p is greater than the Laplace pressure, the target mixture 111 flows through the capillary tube 114 and is ejected into the chamber 109 through the orifice 119. The Laplace pressure is the difference in pressure between the inside and the outside of a curved surface that forms the boundary between a gas region and a liquid region. The pressure difference is caused by the surface tension of the interface between the liquid and the gas. When the pressure p is greater than the Laplace pressure, the target mixture 111 exits the orifice 119 as a continuous jet 124.

The jet 124 breaks up into individual targets (for example, droplets) according to the Rayleigh-Plateau instability of a liquid jet. By vibrating the capillary tube 114 with the actuator 132, the break-up of the jet 124 is controlled such that the individual droplets coalesce into larger droplets that arrive at the plasma formation location 123 at a desired rate. The motion of the actuator 132 deforms the sidewall 150 of the capillary tube 114, thus producing acoustic waves in the target mixture 111 that is located in the capillary tube 114. Cavitation (that is, gas bubble formation) may occur in the target mixture 111 when the perturbation of the acoustic pressure amplitude in the target mixture 111 in the capillary tube 114 exceeds the pressure p applied to the reservoir 112. The perturbation of the acoustic pressure amplitude in the target mixture 111 may exceed the pressure p, for example, during a start-up procedure when the pressure p is increased from a low starting pressure to an operating pressure, during a shut-down procedure when the pressure p is decreased from the operating pressure to the starting pressure, or when the pressure p drops unexpectedly during operation.

When the conditions are favorable to cavitation, the initial gas bubble may continue to grow over time as more and more residual gas dissolved in the target material diffuses towards the bubble; the gas diffusion, which helps to create bubbles of critical size, as well as the alternating acoustic pressures eventually lead to bubble collapse. The collapse of the bubble may generate a high speed liquid jet that can be directed towards the walls of the capillary tube; as a result a large local pressure (for example, 1 gigapascal (GPa)), which is large enough to damage the capillary tube 114, can be generated. Thus, the formation of the bubbles in the target mixture 111 may result in damage (for example, cracks) in the sidewall 150 or the orifice 119.

Such damage may lead to degradation of the performance of the supply system 110 and the EUV light source 100. For example, when the orifice 119 is damaged, the size of the droplets in the stream 121 is different than expected and the droplets do not arrive in the plasma formation region 123 as expected. Moreover, damage on the edge of the orifice 119 may cause the jet 124 to be emitted from the orifice 119 at an angle such that the droplets in the stream 121 are not directed toward the plasma formation location 123 at all. As such, damage to the orifice 119 may lead to droplets not being irradiated by the light beam 106 and less EUV light or no EUV light being produced. Thus, the performance of the EUV light source 100 may become degraded when cracks form on the orifice 119.

In some prior systems and techniques, material damage to the capillary tube 114 and/or the orifice 119 was thought to be caused exclusively by hard particles (such as, for example, tungsten particles and tin oxide particles) passing through the capillary tube 114 and the orifice 119. As discussed above, such particles may be in the target mixture 111. Although such particles may be removed through traditional mechanical filtration techniques, material damage may still occur due to cavitation in the target mixture 111. Thus, prevention or reduction of cavitation can be helpful for the robust operation of the EUV light source 100.

In the EUV light source 100, a control system 160 is used to prevent or reduce the occurrence of cavitation. Several implementations of the control system 160 and techniques for reducing or eliminating cavitation in the target mixture 111 are discussed below. Before discussing the techniques for reducing or eliminating cavitation, the operation and structure of the supply system 110 are discussed in greater detail.

The actuator 132 is coupled to the control system 160 via a control link 162. In FIG. 1 and FIGS. 3A-3C, 4, and 5, the dashed lines indicate communication paths or links along which electrical signals that include data and information flow. The control system 160 may include or be coupled to a function generator, an electronic processor (not shown), and/or an electronic storage (not shown) to carry out the functions of the control system 160. The control link 162 is any type of connection capable of transmitting data from the control system 160 to the actuator 132. For example, the control link 162 may be a wired and/or wireless connection configured to transmit electronic signals and commands between the control system 160 and the actuator 132. The control system 160 generates signals that, when applied to the actuator 132 or to an element associated with the actuator 132, cause the actuator 132 to move. For example, the actuator 132 may be a piezoelectric ceramic material that changes shape based on an applied voltage. In these implementations, the control system 160 generates signals that are delivered to a function generator (not shown) that applies waveforms to the actuator 132. The magnitude and/or polarity of the waveform applied to the actuator 132 is based on the signals from the control system 160. Due to the mechanical coupling between the capillary tube 114 and the actuator 132, when the actuator 132 moves or vibrates, the sidewall 150 is deformed. Thus, the capillary tube 114 experiences a motion or vibration that corresponds to the motion of the actuator 132.

The motion of the actuator 132 is used to control the characteristics of droplets that arrive at the plasma formation location 123. The control system 160 may provide a signal that has components with at least a first frequency and a second frequency via the control link 162 to thereby drive the actuator 132 to vibrate at the first and second frequencies. The first frequency may be in the megahertz (MHz) range. Vibrating the capillary tube 114 at the first frequency causes the jet 124 to break up into relatively small targets of desired sizes and speeds. The second frequency is lower than the first frequency and it is the frequency of the targets when they are completely formed, matching the frequency of the pump laser pulses of the EUV light source. For example, the second frequency may be in the kilohertz (kHz) range. The second frequency is used to modulate the velocity of the targets in the stream and to encourage droplet coalescence. Driving the capillary tube 114 at the second frequency causes groups of targets to form. In any given group of targets, the various targets travel at different velocities. The targets with higher velocities may coalesce with the targets with lower velocities to form larger coalesced targets that make up the stream of targets 121. These larger targets are separated from each other by a larger distance than the non-coalesced droplets. The larger separation helps to mitigate the influence of the plasma formed from one target on the trajectory of the subsequent targets in the stream of targets 121. After coalescence, the targets in the stream of targets 121 are approximately spherical and have a size that is on the order of 30 micrometer (μm).

By causing the capillary tube 114 to vibrate in this manner, targets may be generated at frequencies of, for example, between 40 to 300 kHz and may travel toward the plasma formation location 123 at a velocity of, for example, between 40 and 120 meters per second (m/s) or up to 500 m/s. The spatial separation between two adjacent targets in the stream of targets 121 may be, for example, between 1 and 3 millimeters (mm). Between 50 and 300 initial droplets (also called Rayleigh droplets) may need to be merged to form a single larger target.

Typically, more than two frequencies are used in the target jet modulation signal. Introducing additional spectral components of the modulation signal allows a better controlled and faster (more efficient) droplet coalescence process. Usually these additional frequencies are the higher order harmonics of the desired frequency of the droplets and are selected in the range between the second frequency (a frequency in the kHz range) and the first frequency (a frequency in the MHz range). The modulation waveform may be composed of several deliberately selected sine waves aligned in phase and amplitude, or a periodic waveform that contains high frequency harmonics of the desired droplet frequency ("second frequency"), such as, for example, a pulse wave, a sawtooth wave, or a sinc wave.

Figure 2A:
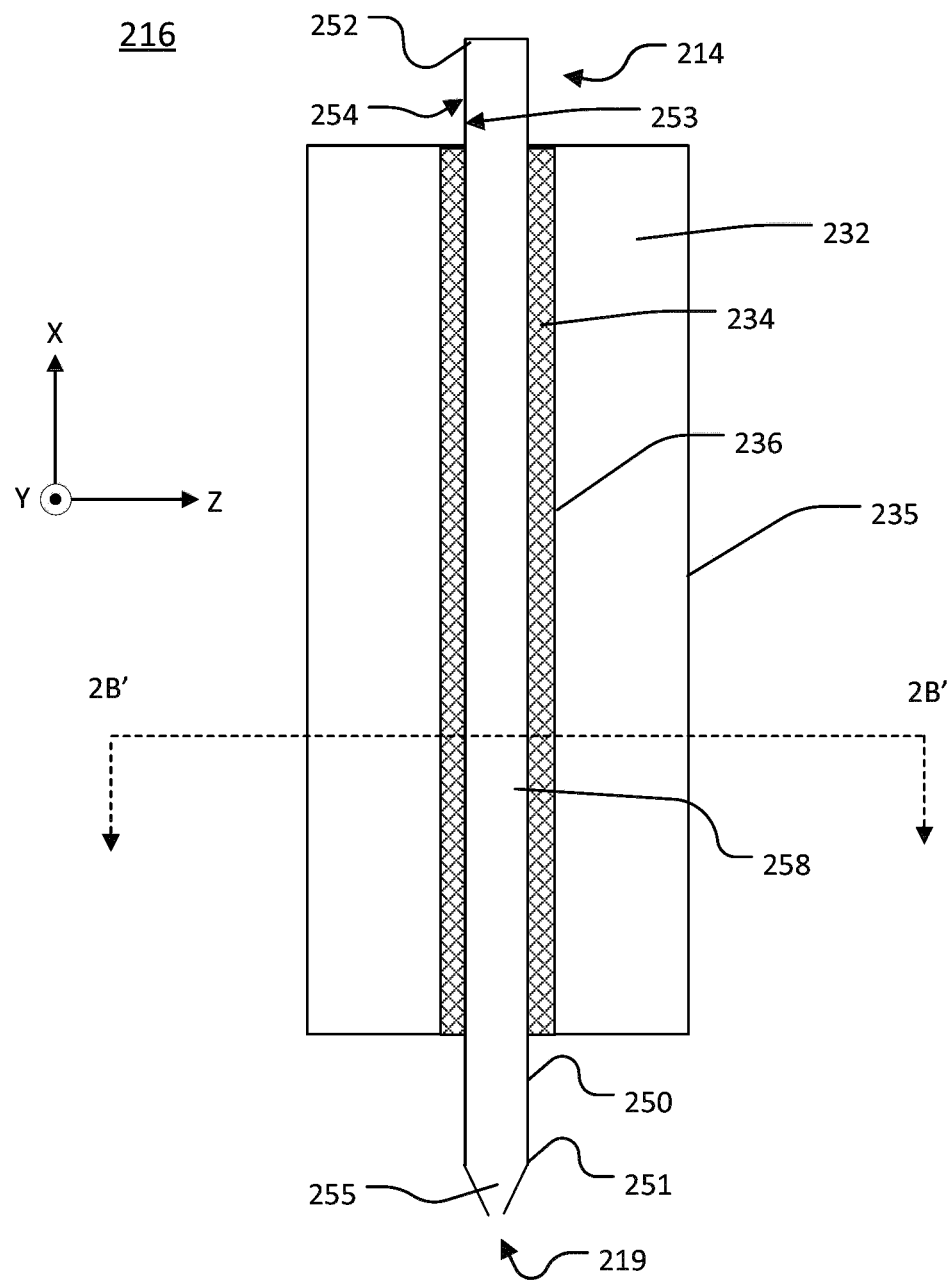
FIG. 2A is a side cross-sectional view of an example of a target formation structure.

FIG. 2A is a side cross-sectional view of a target formation structure 216 in an X-Z plane. FIG. 2B is a top cross-sectional view of the target formation structure 216 in a Y-Z plane taken along the line 2B'-2B' of FIG. 2A.

The target formation structure 216 may be used in the EUV light source 100 (FIG. 1) in place of the capillary tube 114, the actuator 132, and the adhesive 134. The target formation structure 216 includes a capillary tube 214 that is mechanically coupled to an actuator 232 by an adhesive 234 (shown in cross-hatch shading). The adhesive 234 is any type of adhesive capable of mechanically coupling the capillary tube 214 and the actuator 232. For example, the adhesive 234 may be a benzoxazine resin, a resin containing benzoxazines, a cyanate ester resin, a resin containing cyanate esters, bismaleimide based adhesive, or an epoxy.

The capillary tube 214 includes a sidewall 250 that extends along the X direction from a first end 251 to a second end 252. The sidewall 250 is a three-dimensional object that is generally cylindrical. The sidewall 250 includes an inner surface 253 and an outer surface 254. The inner surface 253 defines an interior region 258 (FIGS. 2A and 2B) that is in fluid communication with a nozzle 255 at the first end 251. The nozzle 255 narrows along the −X direction to define an orifice 219. In operational use, the interior region 258 is fluidly coupled to a reservoir (such as the reservoir 112 of FIG. 1) that holds a target mixture (such as the target mixture 111), and the target mixture flows in the interior region 258 of the capillary tube 214 and through the orifice 219 in the −X direction.

Defects, such as, for example, microcracks, indentations, recesses, and particles, on the inner surface 253 and/or the orifice 219 may serve as nucleation sites that encourage cavitation and formation of gas bubbles in the target mixture 111. To reduce or eliminate the formation of these bubbles, the inner surface 253 and the orifice are manufactured to be substantially free of defects. For example, the inner surface 253 and the orifice 119 may be firepolished. Firepolishing is a technique in which a rough edge of a glass object is polished by applying flame to the edge.

In the example of FIGS. 2A and 2B, the actuator 232 is a cylinder with an outer actuator surface 235 and an inner actuator surface 236. The inner actuator surface 236 defines an open central region that extends along the X direction. The inner actuator surface 236 surrounds the outer surface 254. The actuator 232 is made of any material that is capable of causing the sidewall 250 to move. For example, the actuator 232 may be a piezoelectric ceramic material such as lead zirconate titanate (PZT) that changes shape in response to the application of voltage. By changing shape, the PZT also causes the sidewall 250 of the capillary tube 214 to deform. For example, the actuator 232 may vibrate or squeeze the sidewall 250 of the capillary tube 214.

Figure 3A:
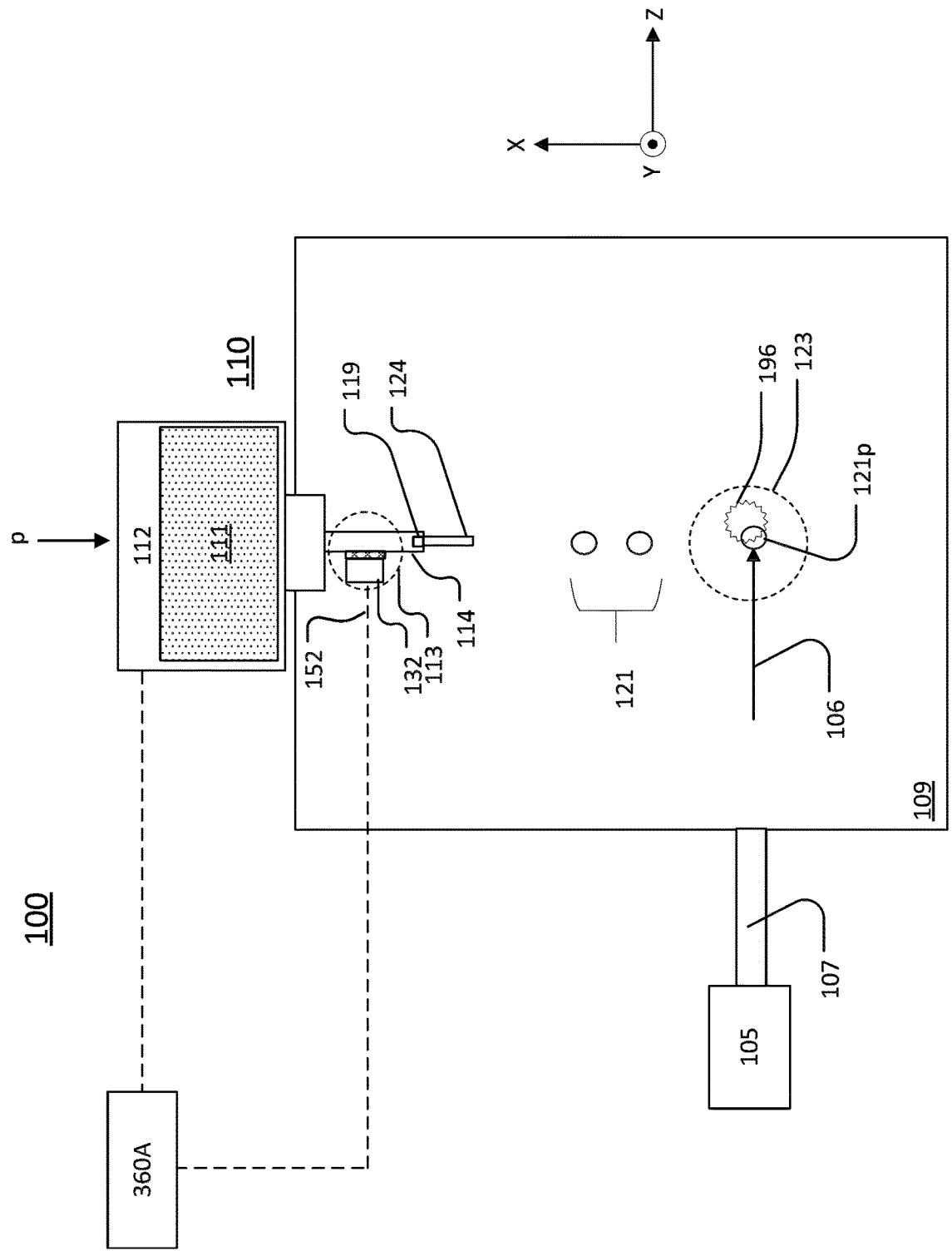
FIGS. 3A-3C and 4 are block diagrams of examples of the EUV light source of FIG. 1 with various control systems.

Referring to FIG. 3A, a block diagram of the EUV light source 100 with a control system 360A is shown. The control system 360A is an example of an implementation of the control system 160 (FIG. 1).

The control system 360A is coupled to the reservoir 112 and to the actuator 132. The control system 360A controls the actuator 132 based on the pressure p applied to the target mixture 111. For example, the control system 360A may control the actuator 132 such that the actuator 132 only vibrates the capillary tube 114 when the pressure p is greater than a threshold pressure. The threshold pressure is a pressure that is lower than the operating pressure. The operating pressure is the value of the pressure p during typical operation when the light source 100 is producing EUV light. The operating pressure may be, for example, 3000-15000 (psi) or higher. The threshold pressure may be, for example, 200-1000 psi. Thus, the control system 360A may prevent the capillary tube 114 from being vibrated unless the pressure p is greater than 200 psi, greater than 500 psi, or greater than 1000 psi. The exact value of the threshold pressure is defined by the maximum amplitude of the pressure wave created in the capillary tube by the actuator. By preventing the capillary tube 114 from vibrating when the pressure p is relatively low, the control system 360A prevents or reduces cavitation.

Figure 3B:
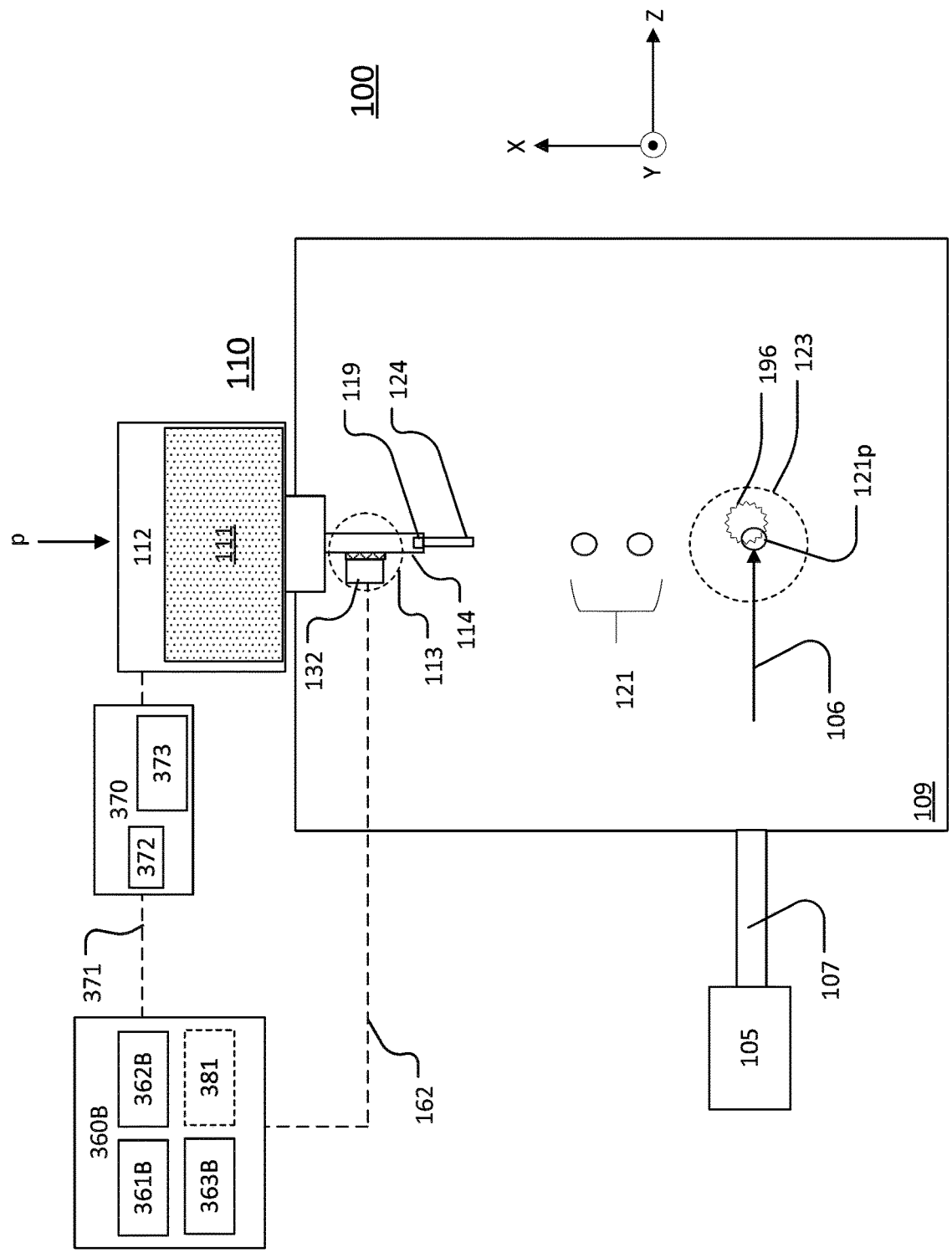
Figure 3C:
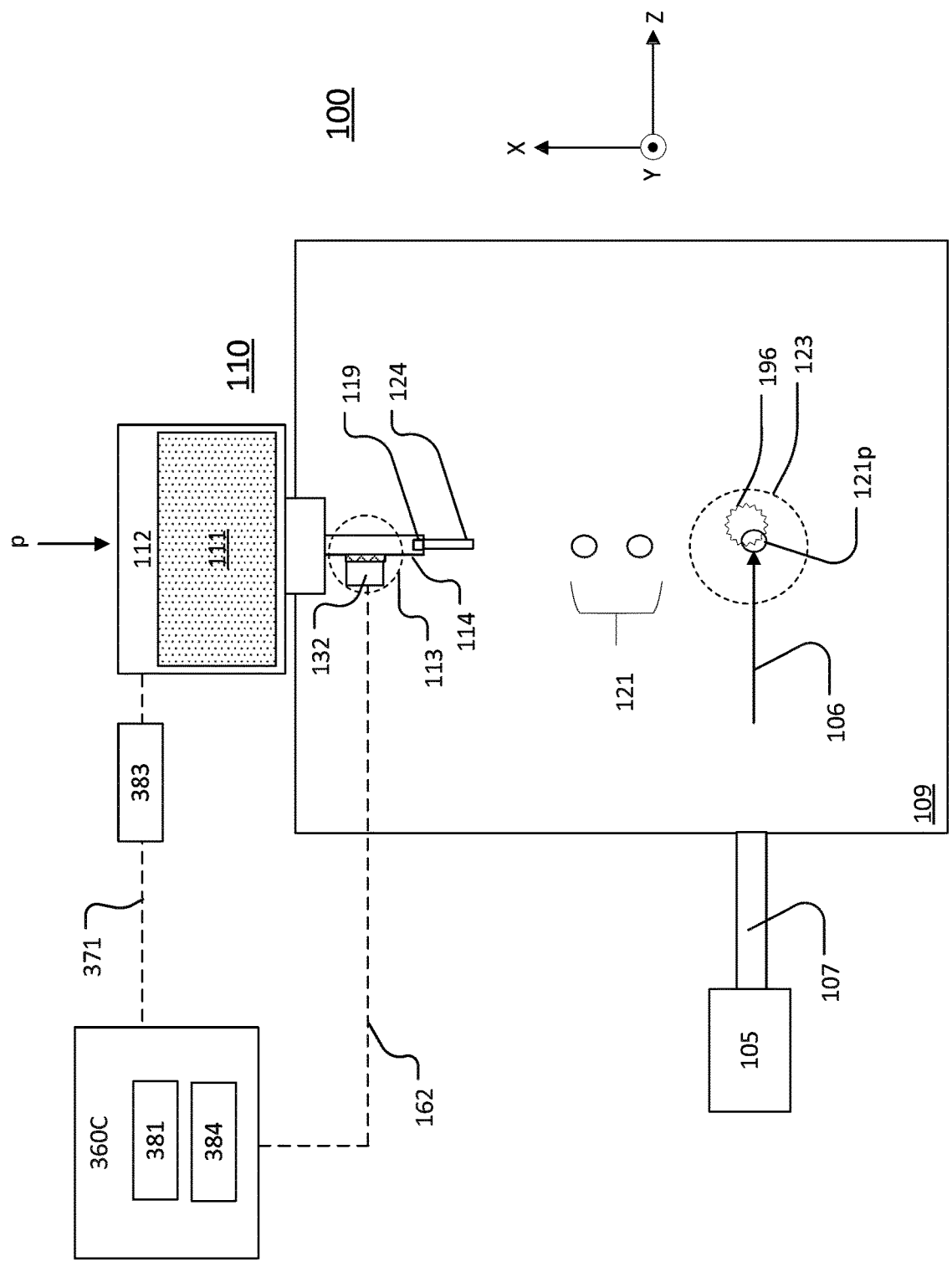

The control system 360A may be implemented in a variety of ways, and two examples are discussed with respect to FIGS. 3B and 3C.

FIG. 3B is a block diagram of the EUV light source 100 with a control system 360B. The control system 360B is an implementation of the control system 360A. The control system 360B is coupled to a pressure system 370, which pressurizes the reservoir 112. The pressure system 370 includes a pressure device system 373, which includes, for example, pumps, gas supplies, valves, and/or other devices that are able to increase, decrease, or maintain the pressure p applied to the target mixture 111 in the reservoir 112.

The pressure system 370 also includes a communications interface 372 that couples to a data link 371. The pressure system 370 and the control system 360B are coupled by the data link 371. The data link 371 is any type of communications channel over which data, information, and/or commands may be provided, and the data link 371 may be a wired or wireless connection. The pressure system 370 may provide the value of the applied pressure p (or an indication of the value applied pressure p) to the control system 360B via the data link 371, or the control system 360B may retrieve the value of the pressure p from the pressure system 370. In some implementations, the pressure system 370 includes a pressure sensor (not shown) that measures the applied pressure p. In other implementations, the pressure system 370 is calibrated to apply a particular pressure p, and the pressure system 370 provides information related to the applied pressure p without measuring the actual applied pressure p.

The control system 360B is implemented using an electronic processor 361B, an electronic storage 362B, and an I/O interface 363B. The I/O interface 363B is any type of interface that allows the control system 360B to receive or send information or data. For example, the I/O interface 363B may be a keyboard, mouse, or other computer peripheral device that enables an operator to operate and/or program the control system 360B. The I/O interface 363B may include devices that produce a perceivable alert such as a light or a speaker. Furthermore, the I/O interface 363B may include a communications interface such as a universal serial port (USB), a network connection, or any other interface that allows communication with the control system 360B.

The electronic processor 361B includes one or more processors suitable for the execution of a computer program such as a general or special purpose microprocessor, and any one or more processors of any kind of digital computer. Generally, an electronic processor receives instructions and data from a read-only memory, a random access memory (RAM), or both. The electronic processor 361B may be any type of suitable electronic processor.

The electronic storage 362B may be volatile memory, such as RAM, or non-volatile memory. In some implementations, and the electronic storage 362B includes non-volatile and volatile portions or components. The electronic storage 362B may store data and information that is used in the operation of the control system 360B. For example, the electronic storage 362B may store information about the operation of the supply system 110 and/or the pressure system 370. In some implementations, the electronic storage 362B stores the value of the pressure p that should be applied during typical operation of the supply system 110. Moreover, the electronic storage stores a threshold value. The threshold value is a value that is or relates to a pressure below which cavitation is known to occur or is likely to occur. For example, the threshold value may be a pressure expressed in PSI or a value (such as a voltage value produced by a switch or electrical device) that correlates to the pressure below which cavitation is known to occur or is likely to occur.

Additionally, the electronic storage 362B stores instructions (for example, in the form of the computer program), that, when executed, cause the electronic processor 361B to provide electrical signals (for example, modulation signals or excitation signals) to the actuator 132 to cause the actuator 132 to vibrate the capillary tube 114. The electronic storage 362B may store information that is sufficient to cause the electronic processor 361B to produce modulation signals with a variety of different characteristics. For example, the control system 360B may produce a modulation signal that is a sine wave voltage signal having a particular maximum, minimum amplitude, and frequency, or a square wave having a particular duty cycle, maximum amplitude, and minimum amplitude, or a combination of such waveforms. In this way, the control system 360B also is capable of performing as a function generator.

The electronic storage 362B also stores instructions (for example, in the form of a computer program) that implement various analyses related to the prevention of cavitation or reduction in occurrences of cavitation. For example, the electronic storage 362B may store instructions that analyze a pressure value from the pressure system 370 and compare the value to the threshold value stored in the electronic storage 362B. The electronic storage 362B also may include instructions related to the operation of the supply system 110 that depend on the outcome of the comparison between the stored threshold value and the value of the pressure p indicated by the pressure system 370.

The electronic storage 362B also stores instructions, such as a computer program, that, when executed, cause the electronic processor 361B to communicate with components in the supply system 110 and/or the pressure system 370. For example, the electronic storage 362B stores instructions that cause the electronic processor 361B to provide modulation signals via the link 162 that are sufficient to cause the actuator 132 to vibrate the capillary tube 114 only when the pressure provided from the pressure system 370 is greater than the stored threshold pressure.

In some implementations, the control system 360B also includes an electrical switch 381 that is used to control the flow of modulation signals to the actuator 132. The electrical switch 381 has a plurality of states, fewer than all of which allow signals from the control system 360B to reach the actuator 132. For example, the electrical switch 381 may have an ON state in which the switch 381 passes electrical signals from the control system 360B to the actuator 132 and an OFF state in which the switch 381 does not allow modulation signals from the control system 360B to reach the actuator.

FIG. 3C is a block diagram of the EUV light source 100 with a control system 360C. The control system 360C is another example of an implementation of the control system 360A. The control system 360C includes the electrical switch 381. In the implementation of FIG. 3C, the electrical switch 381 is used to directly control the operation of a function generator 384 that provides modulation signals to the actuator 132 via the link 162.

The electrical switch 381 is coupled to a pressure indicator 383 and the function generator 384. The electrical switch 381 receives an indication of the amount of pressure p from the pressure indicator 383. The switch 381 has a plurality of states, and the state of the switch 381 is determined by the pressure p received from the pressure indicator. In at least one state, the switch 381 prevents modulation signals generated by the function generator 384 from reaching the actuator 132. In at least one other state, the switch 381 allows modulation signals generated by the function generator 384 to reach the actuator 132. For example, the electrical switch 381 may enable the output signal in the function generator 384 in one state and not in another state. In another example, the electrical switch 381 opens an electrical path between the function generator 384 and the actuator 132 in one state and closes the electrical path in another state. In this implementation, the modulation signals are only able to reach the actuator when the electrical path is closed. Thus, the control system 360C controls the operation of the actuator 132 (and thus the vibration of the capillary tube 114) based on the pressure p.

The pressure indicator 383 is any type of device that is capable of producing an electrical signal (for example, a voltage and/or an electrical current) that represents the value of the pressure p. In some implementations, the pressure indicator 383 is a pressure sensor that measures the pressure p directly and produces an electrical signal that represents the measured pressure p. In these implementations, the electrical signal from the pressure indicator 383 is an electrical current or voltage that has an amplitude that indicates the measured amount of applied pressure p. The amplitude of the electrical signal from the pressure sensor is sufficient to cause the electrical switch 381 to change states. For example, the electrical signal may be a voltage signal, and the electrical switch 381 may be a transistor or diode that allows electrical current to flow only when the magnitude of the voltage signal is above a certain value.

In other implementations, a pressure switch is used as the pressure indicator 383. A pressure switch is a switch that closes an electrical circuit when a pre-determined fluid pressure is reached at the input of the pressure switch. The pressure switch may be, for example, a capsule that includes a moving element such as bellows, a piston, or a diaphragm that moves or deforms based on the pressure at the input of the pressure switch. When the pre-determined pressure is reached or exceeded, the motion or deformation causes electrical contacts to make physical contact, thereby closing the pressure switch.

In implementations that use a pressure switch as the pressure indicator 383, the input of the pressure switch is coupled to the reservoir 112 such that pressure switch is closed when the pressure p applied to the target mixture 111 is greater than the pre-determined fluid pressure. The output of the pressure switch is coupled to the electrical switch 381. When the pressure switch is closed (that is, when the pressure p of the target mixture 111 is greater than the pre-determined pressure), the electrical switch 381 is a state in which the electrical switch 381 allows modulation signals generated by a function generator 384 to reach the actuator 132. For example, in some implementations, when the pressure switch is closed, the electrical switch 381 is in a state that conducts current and allows current to flow to the function generator such that the function generator is powered and generates modulation signals that are delivered to the actuator 132 via the link 162. In these implementations, when the pressure switch is open (that is, when the pressure p is below the pre-set pressure), the electrical switch 381 is open and does not conduct current or provide electrical current to the function generator 384. Thus, when the pressure p is below the pre-determined pressure, the function generator is 384 is not powered and modulation signals are not generated and are not delivered to the actuator 132.

Figure 4:
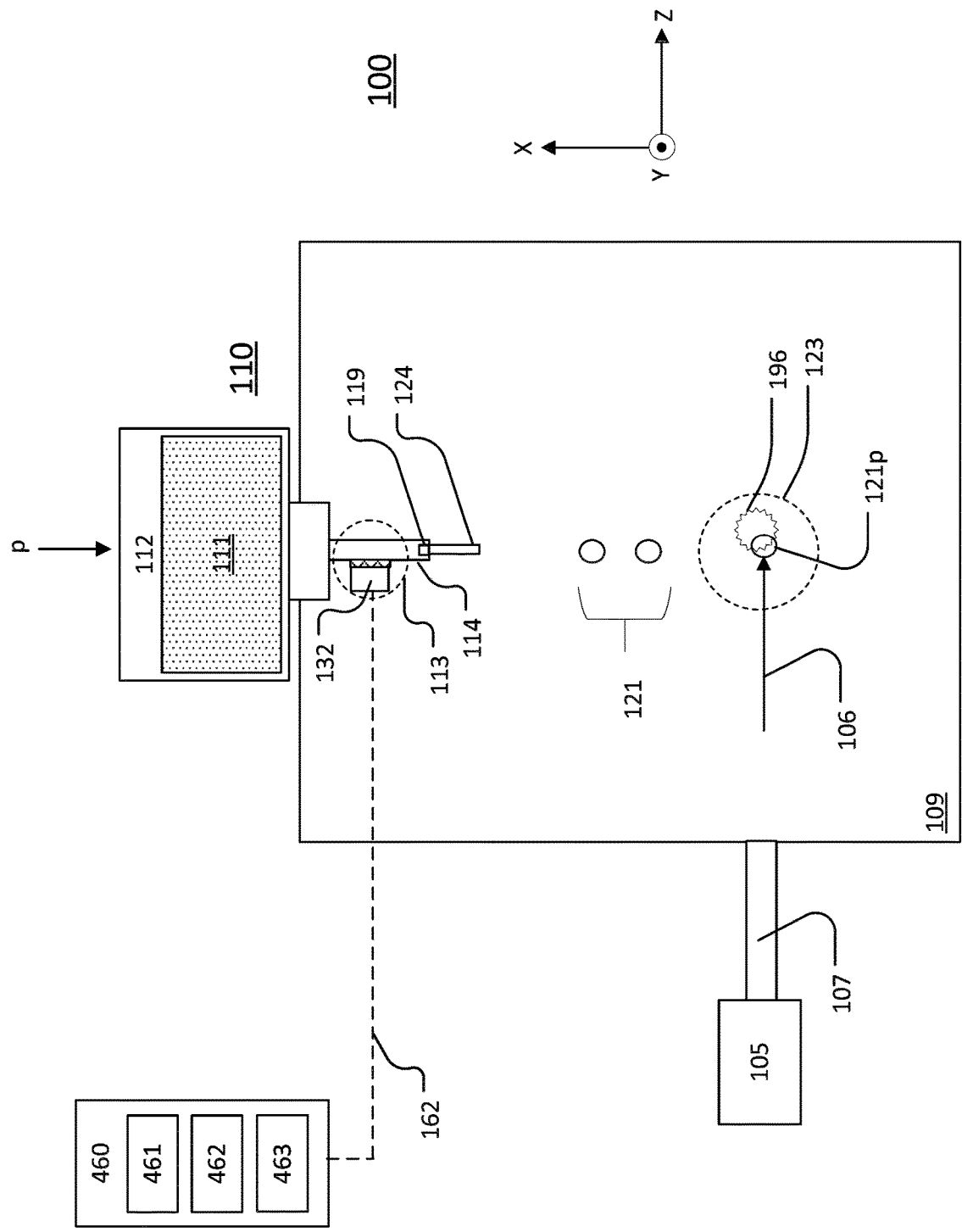

FIG. 4 is a block diagram of the EUV light source 100 with a control system 460. The control system 460 is an example of an implementation of the control system 160 (FIG. 1). The control system 460 reduces or prevents cavitation in the target mixture 111 that flows in the capillary tube 114 by controlling the frequencies at which the actuator 132 is vibrated and controlling the frequency content of the modulation signals applied to the actuator 132.

As discussed above, during typical operation, the actuator 132 is driven with an electrical waveform that is composed to encourage droplet coalescence to produce individual droplets that arrive at the plasma formation location 123 at a desired rate and have a desired size. The modulation signals used to drive the actuator 132 may include components at frequencies that do not contribute to droplet coalescence. Moreover, modulating the actuator 132 with these other frequencies may increase the chance of cavitation. For example, modulating the actuator 132 at relatively low frequencies other than the desired frequency of the fully coalesced droplets may increase the chance of cavitation because the cavitation acoustic power density threshold in the target material is a function of modulation frequency (that is, the cavitation acoustic power density threshold is lower for the lower modulation frequencies and thus cavitation occurs more readily at lower modulation frequencies). Thus, in some implementations, the control system 460 is configured to remove or reduce the amplitude of components of the modulation signal that are below a frequency threshold and are not critically contributing to the droplet coalescence process.

The mechanically coupled actuator 132 and the capillary tube 114 form a target formation structure that is associated with eigenmodes, which are the normal vibrational modes of the structure formed by the mechanically coupled actuator 132 and the capillary tube 114. Driving the actuator 132 with modulation signals that include frequencies associated with an eigenmode of the structure, a harmonic of an eigenmode of the structure, or a sub-harmonic of an eigenmode of the structure increases the likelihood of cavitation. For example, in implementations in which the actuator 132 is a tube structure (such as the actuator 232 discussed with respect to FIGS. 2A and 2B), driving the actuator 132 at frequencies that coincide with a length or longitudinal mode mechanical resonance of the actuator 132 (typically in 200-600 kHz range) may increase the likelihood of cavitation in the target mixture 111 as the amplitude of the acoustic waves at these frequencies for a given modulation voltage is greater due to a resonance effect.

The control system 460 is configured to remove or reduce the amplitude of frequencies associated with eigenmodes of the combined capillary tube 114 and actuator 132 structure, the actuator 132, and/or the capillary tube 114. For example, the mechanical characteristics of the actuator 132 and the capillary tube 114 may be assessed during manufacture and the frequencies to be avoided or minimized are stored in the electronic storage 462. During operational use, the control system 460 removes or filters the frequencies from the modulation signal before applying the modulation signal to the actuator 132.

The control system 460 includes an electronic processor 461, an electronic storage 462, and an I/O interface 463. The electronic processor 461 is any type of electronic processor 461 that is capable of processing data and executing instructions. The control system 460 may include more than one electronic processor 461. The electronic storage 462 is any type of electronic memory and may include volatile and/or non-volatile components. The I/O interface 463 is any type of interface that allows an operator or an external device to communicate with the control system 460. Similar to the control system 360B discussed with respect to FIG. 3B, the control system 460 is capable of being configured to behave as a function generator. Thus, the control system 460 may produce modulation signals (for example, voltage and/or current signals) that are used to modulate or drive the actuator 132.

The electronic storage 462 stores instructions, such as in the form of a computer program, that control the frequency content of the modulation signals produced by the control system 460. For example, the electronic storage 462 may store a threshold frequency value that is used as the minimum frequency value for an modulation signal produced by the control system 460. In another example, the electronic storage 462 stores instructions that analyze and filter modulation signals such that unwanted frequency components are removed or reduced in amplitude prior to being provided to the actuator 132. In yet another example, the electronic storage 462 stores minimum amplitude values that represent the largest amplitude of a frequency components that is reduced may have. The minimum amplitude values may be peak-to-peak values and/or maximum values.

The undesired driving frequencies may vary among different instances of the supply system 110. Thus, the mechanical properties of the supply system 110 are assessed during the manufacturing or assembling process. In some implementations, the operator of the EUV light source 100 may add to or change the frequencies to be avoided or minimized as needed during the lifetime of the EUV light source 100. In other implementations, a machine-readable tag, such as a radio-frequency identification (RFID) tag, on the supply system 110 contains information (such as undesired driving frequencies) specific to the supply system 110. Reading the tag with an appropriate device (for example, an RFID reader) causes the information about the supply system 110 to be saved in the control system 460 and used during operation of the supply system 110.

Figure 5:
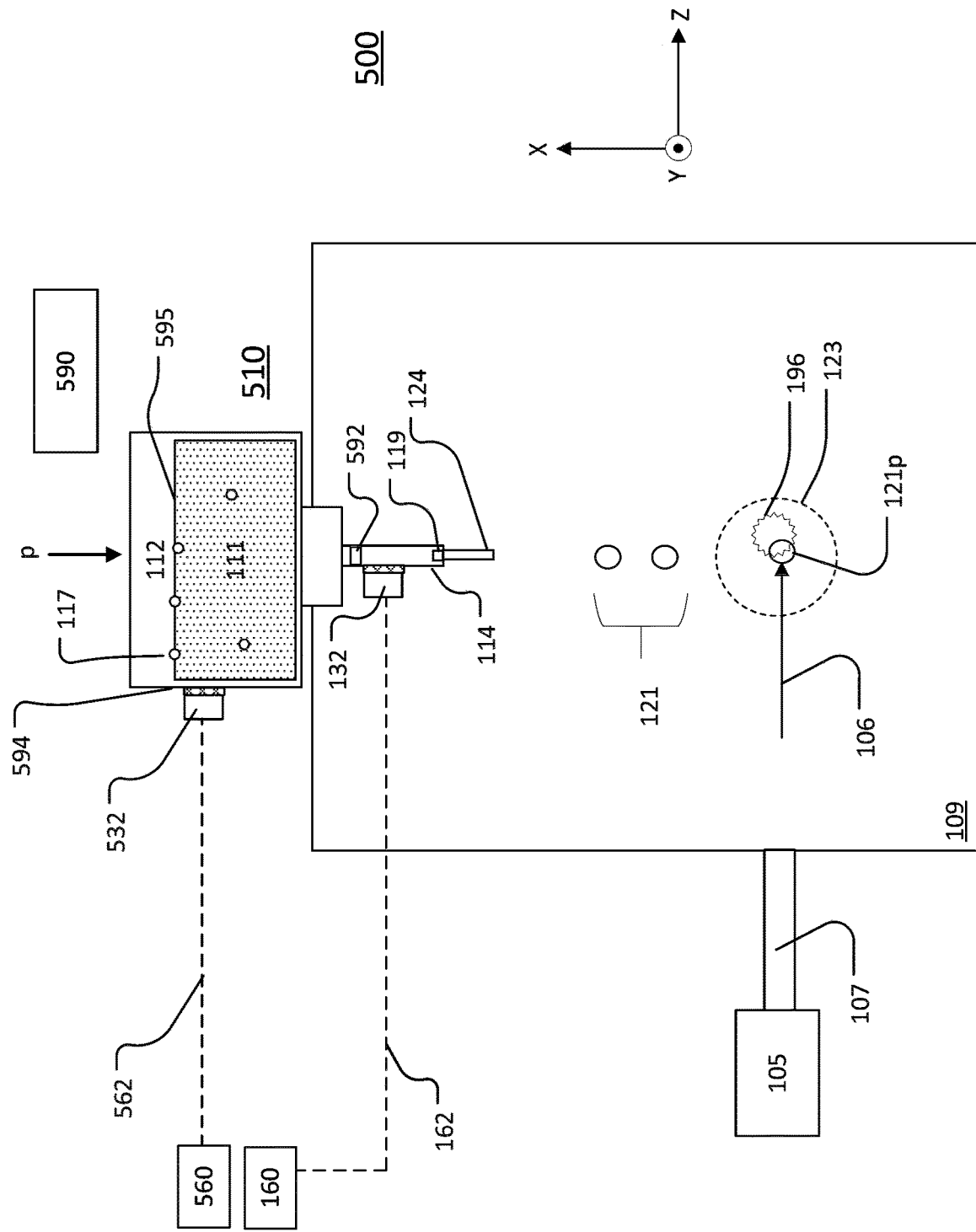
FIG. 5 is a block diagram of another example of an EUV light source.

FIG. 5 is a block diagram of an EUV light source 500. The EUV light source 500 is similar to the EUV light source 100 (FIG. 1), except the EUV light source 500 includes a supply system 510 that includes an actuator 532 mechanically mounted to the reservoir 112. The EUV light source 500 uses ultrasonic and/or mechanical filtration to remove or reduce the inclusion particles 117 in the target mixture 111. As discussed above, particulate material may act as nucleation sites for cavitation, thus it is desirable to remove the inclusion particles 117 from the target mixture 111 before the mixture 111 reaches the orifice 119. The liquid target mixture 111 that is held in the reservoir 112 includes the target material (for example, melted tin) and inclusion particles 117. The inclusion particles 117 may include, for example, tin oxide ($SnO_2$) particles. The inclusion particles 117 are particles that are not target material and are not needed to produce the plasma 196. The inclusion particles 117 may thus be removed from the target mixture 111 without impacting the production of EUV light.

In some implementations, the supply system 510 includes one or more filters 592 between the reservoir 112 and the orifice 119. The filters 592 have openings that are smaller than the diameter of most of the inclusion particles 117. For example, the filters 592 may be formed of a solid metal bulk material that includes through-holes having a diameter that is smaller than the diameter of the inclusion particles 116 and/or the filters 592 may be made of a mesh or sintered material. The filters 592 are positioned such that the target mixture 111 interacts with the filter 592 and the liquid target material flows through the filter 592. Most of the inclusion particles 117 are unable to flow through the filter 592 and thus do not reach the orifice 119.

The filters 592 are designed to capture small particles (for example, down to about 20 nanometers (nm) size). Filters used in EUV supply systems are typically designed to capture particles in the 1-10 μm size range, which is a size that is on the order of the diameter of the orifice 119. Thus, it is typical to use a filter that is designed to capture particles in the 1-10 μm size range to prevent the clogging of the nozzle orifice. However, the filters 592 are also intended to capture smaller particles that are less than 1 μm in size. For example, the filters 592 may be designed to capture particles that are 20 nm in size. The filters 592 are designed to capture such small particles because the cavitation can be promoted by the nucleation sites in a form of nanoscale size particles. Thus, the filters 592 are intentionally different than those that are typically used in EUV supply systems.

Alternatively or additionally, an ultrasonic filtration technique is used to remove or reduce the inclusion particles 117. Ultrasonic filtration is a technique that removes or localizes particulate debris that is present in a fluid by applying an ultrasonic modulation signal to the fluid.

The actuator 532 is mechanically coupled to a wall 594 of the reservoir 112. A control system 560 provides modulation signals to the actuator 532 via a data link 562. The actuator 532 is driven at an ultrasonic frequency, for example, 20-30 kHz. Driving the actuator 532 creates pressure waves in the target mixture 111 in the reservoir 112. At a sufficiently high acoustic power, the pressure waves produce cavitation bubbles attached to the small particles that carry the particles towards the surface 595 due to buoyancy force. Once at the surface 595, the inclusion particles 117 remain at the surface 595 since the density of the oxide is lower than that of the target material itself, unless there is a significant convection flow of the target material due to large temperature gradients in the reservoir 112. Thus, in typical operating conditions and when the target mixture 111 is not completely drained from the reservoir 112, the inclusion particles 117 remain at the surface 595 and do not flow into the capillary tube 114 or the orifice 119. Thus, cavitation in the capillary tube 114 is reduced. This cleaning is done periodically only for a short period of time when the EUV light source 500 is not used to produce EUV light.

In the example of FIG. 5, the EUV light source 500 includes a gas supply system 590. The gas supply system 590 emits a gas that flows over the surface 595. The gas supply system 590 includes components that are configured to control, regulate, and/or produce a flowing gas. For example, the gas supply system 590 may include gas canisters that hold gas, tubes, valves, pipes, and/or pumps.

The gas that flows from the gas supply system 590 is a gas that reacts with the inclusion particles 117 (which have moved toward the surface 595). For example, in implementations in which the inclusion particles 117 are particles of tin oxide ($SnO_2$), the gas supply system produces hydrogen gas that flows over the surface 595. The hydrogen gas reacts with the tin oxide inclusion particles 117 to form molecules of tin and water, and these formed molecules are removed from the surface 595.

Referring to FIG. 6, a flow chart of a process 600 is shown. The process 600 is an example of a process use to operate a supply system of an EUV light source in a manner that avoids or reduces the occurrence of cavitation in the capillary tube 114. By reducing or eliminating the occurrence of cavitation, the process 600 helps to ensure that the orifice 119 remains damage-free during operational use. The process 600 may be performed by any of the control systems 160, 360A, 360B, 360C, 460, and 560. The process 600 is discussed with respect to the supply system 110 and the supply system 510.

One or more characteristics of the supply system 110 are determined (610). The characteristics may relate to a pressure. For example, the applied pressure p may be measured by a pressure sensor or determined by a pressure switch. In another example, the characteristic is a threshold pressure below which the actuator 132 is not to be operated.

In some implementations, the characteristics relate to a frequency at which the capillary tube 114 is vibrated. In these implementations, the characteristic may be a threshold frequency. The threshold frequency is the lowest frequency at which the capillary tube 114 may vibrate without cavitation occurring. The threshold frequency may be determined at the time the supply system 110 is manufactured or assembled, or the threshold frequency may be determined in the field by an end user. The characteristic related to a frequency also may relate to the physical structure of the supply system 110. For example, cavitation is more likely to occur when the capillary tube 114 is vibrated at a frequency that is an eigenmode of the structure formed by the actuator 132 and the capillary tube 114, or a harmonic or subharmonic of an eigenmode.

In some implementations, the characteristics relate to the configuration of the supply system. For example, the characteristic may relate to whether or not an actuator (such as the actuator 532 shown in the supply system 510) is coupled to the reservoir 112.

An actuator that is mechanically coupled to the supply system 110 is controlled such that the orifice 119 remains substantially free of material damage (620). For example, the actuator 132 may be controlled based on the amount of applied pressure p. In another example, the actuator 132 may be controlled such that the capillary tube 114 is not vibrated with excitations having certain frequency components or certain ranges of frequency components. In yet another example, the actuator 532 is controlled to provide ultrasonic vibration to the target mixture 111 in the reservoir to encourage the inclusion particles 117 to move to the surface 595.

Additionally, more than one technique may be used to prevent or reduce cavitation. For example, the applied pressure p may be used to control the actuator 132, as discussed with respect to FIGS. 3A-3C and the frequency content of the modulation signals provided to the actuator 132 may be controlled as discussed with respect to FIG. 4. Moreover, the ultrasonic filtering and/or mechanical filtering discussed with respect to FIG. 5 may be used with the techniques discussed with respect to FIGS. 3A-3C and/or FIG. 4. Finally, any of the control systems discussed above and any of the supply systems discussed above may be used with the target formation structure 216 (FIGS. 2A and 2B) instead of the actuator 132 and the capillary tube 114.

The conduit and orifice damage by cavitation are not uniquely attributable to the target supply system in the configurations described above. The same problem may occur in supply systems that have other configurations, and the same mitigation measures can be applied to the supply system in other commonly used configurations. For example, the target supply system may include a conduit for the target material made in a high strength metal or ceramic material instead of a glass capillary. In these implementations, the conduit is coupled to an orifice plate with a small orifice designed to output the target material in a form of a liquid jet that is broken into droplets. Modulation of the liquid jet in such configuration may be accomplished with a mechanically pre-loaded piezoelectric actuator that creates acoustic waves in the target material by vibrating the conduit wall or a thin membrane that may be introduced in the design of the supply system for the purpose of facilitating the modulation. Moreover, the actuator may have a tubular shape, or may have any other shape that is suitable for the effective excitation of the acoustic waves in the target material located in the conduit. For example, the actuator may have a shape of a disk or a stack of disks. The action of the actuator may be enhanced by an acoustic (Helmholtz type) resonator that can be formed in the conduit.

Figure 7A:
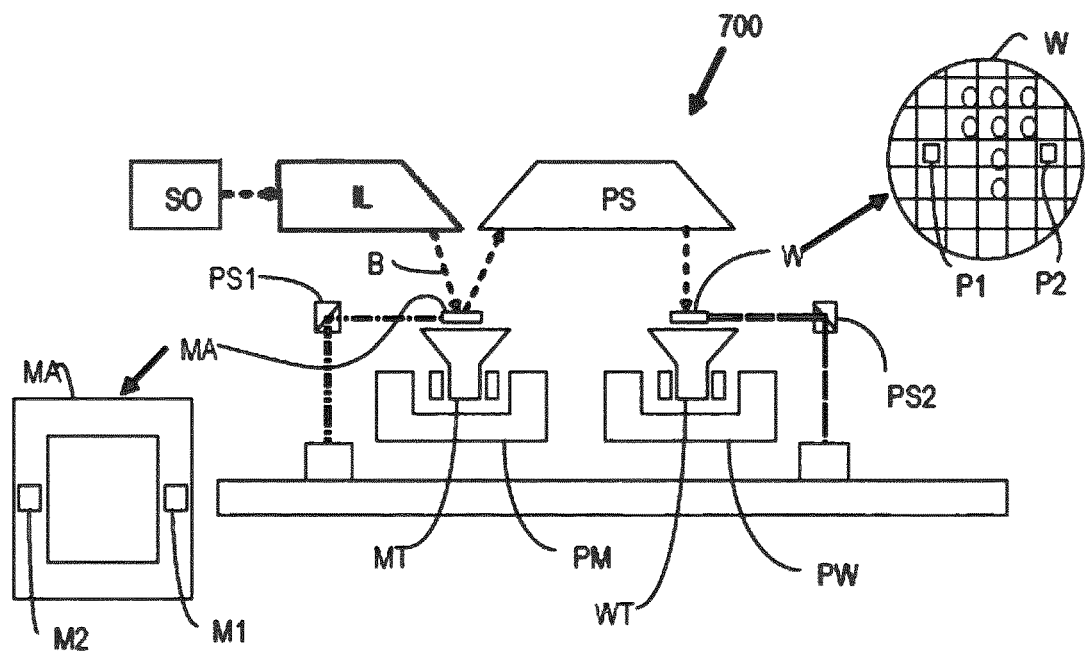
FIGS. 7A and 7B are block diagrams of an example of a lithographic apparatus.
Figure 7B:
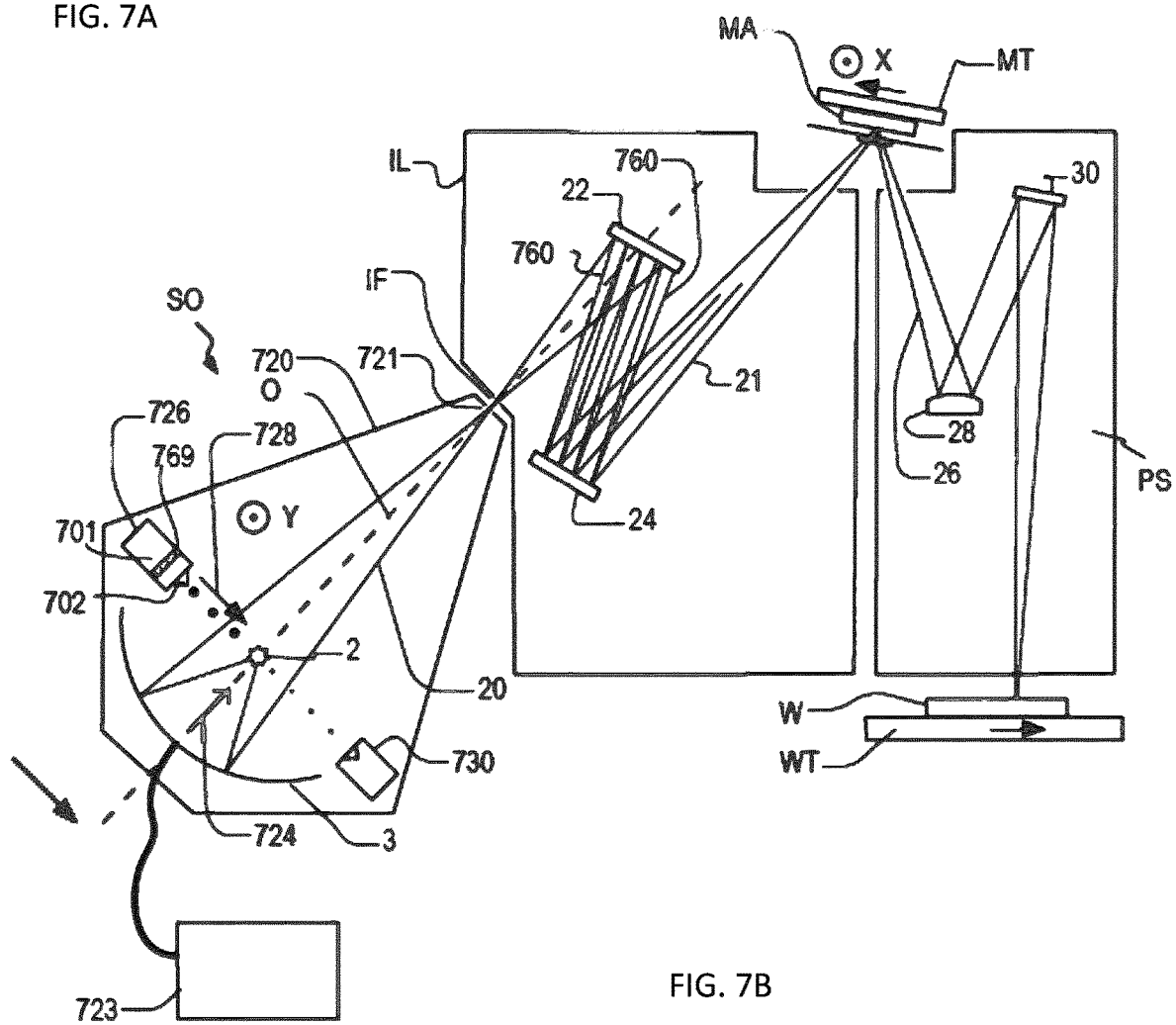
Figure 8:
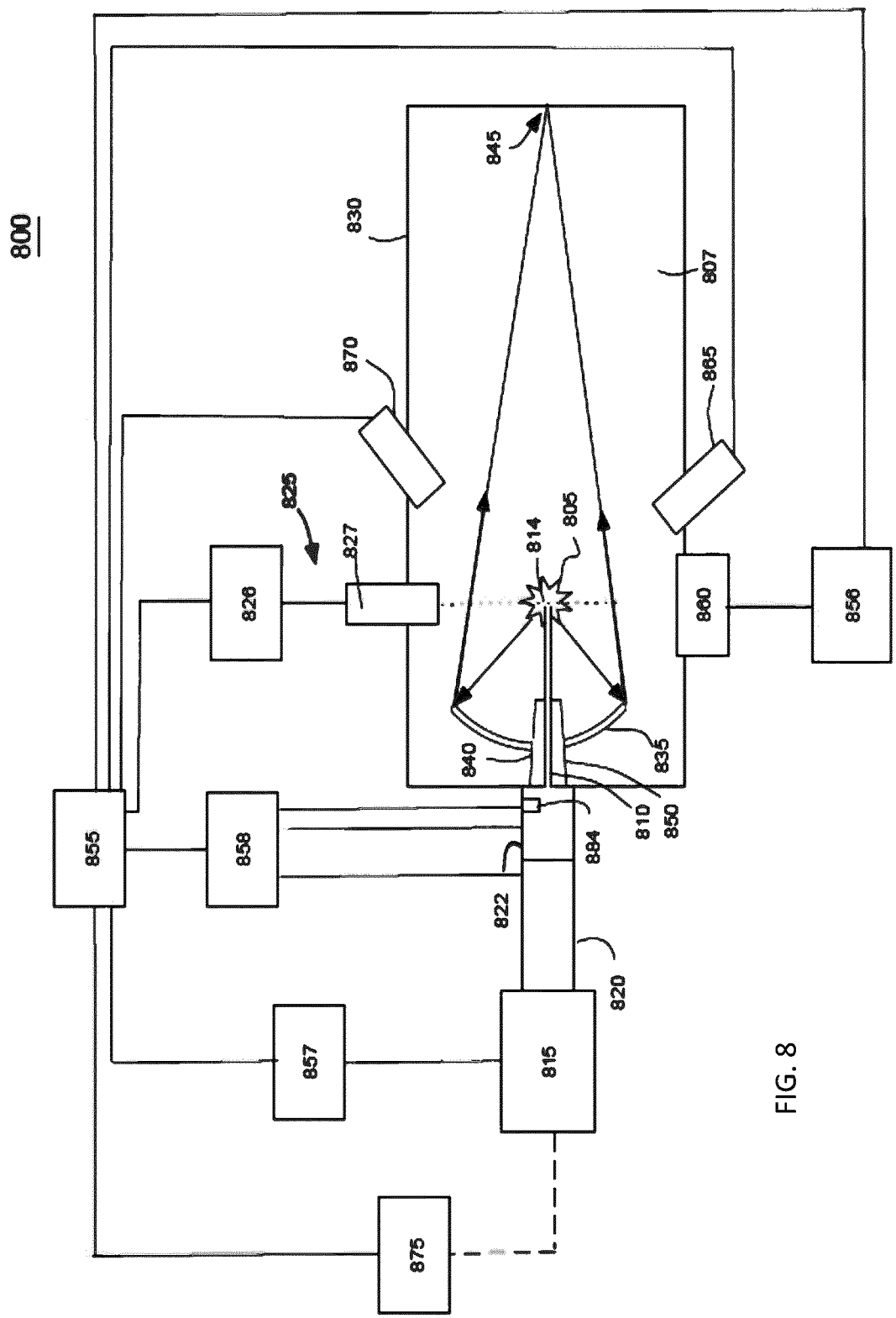
FIG. 8 is a block diagram of an example of an EUV light source.

FIGS. 7A and 7B are an example of an EUV lithographic apparatus that may use the control systems and/or supply systems discussed above. FIG. 8 is an example of an EUV light source that may use the control systems and/or supply systems discussed above.

FIG. 7A is a block diagram of a lithographic apparatus 700 that includes a source collector module SO. The lithographic apparatus 700 includes:
an illumination system (illuminator) IL configured to condition a radiation beam B (for example, EUV radiation).
a support structure (for example, a mask table) MT constructed to support a patterning device (for example, a mask or a reticle) MA and connected to a first positioner PM configured to accurately position the patterning device;
a substrate table (for example, a wafer table) WT constructed to hold a substrate (for example, a resist-coated wafer) W and connected to a second positioner PW configured to accurately position the substrate; and
a projection system (for example, a reflective projection system) PS configured to project a pattern imparted to the radiation beam B by patterning device MA onto a target portion C (for example, including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that may be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

In the example of FIGS. 7A and 7B, the apparatus is of a reflective type (for example, employing a reflective mask). The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 7A, the illuminator IL receives an extreme ultraviolet radiation beam from the source collector module SO. Methods to produce EUV light include, but are not necessarily limited to, converting a material into a plasma state that has at least one element, for example, xenon, lithium or tin, with one or more emission lines in the EUV range. In one such method, often termed laser produced plasma ("LPP") the required plasma is produced by irradiating a fuel, such as a droplet, stream or cluster of material having the required line-emitting element, with a laser beam. The source collector module SO may be part of an EUV radiation system including a laser, not shown in FIG. 7A, for providing the laser beam exciting the fuel. The resulting plasma emits output radiation, for example, EUV radiation, which is collected using a radiation collector, disposed in the source collector module. The laser and the source collector module may be separate entities, for example when a carbon dioxide ($CO_2$) laser is used to provide the laser beam for fuel excitation.

In such cases, the laser is not considered to form part of the lithographic apparatus and the radiation beam is passed from the laser to the source collector module with the aid of a beam delivery system including, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator IL may be used to condition the radiation beam, to have a desired uniformity and intensity distribution in its cross-section.

The radiation beam B is incident on the patterning device (for example, mask) MA, which is held on the support structure (for example, mask table) MT, and is patterned by the patterning device. After being reflected from the patterning device (for example, mask) MA, the radiation beam B passes through the projection system PS, which focuses the beam onto a target portion C of the substrate W. With the aid of the second positioner PW and position sensor PS2 (for example, an interferometric device, linear encoder or capacitive sensor), the substrate table WT can be moved accurately, for example, so as to position different target portions C in the path of the radiation beam B. Similarly, the first positioner PM and another position sensor PS1 can be used to accurately position the patterning device (for example mask) MA with respect to the path of the radiation beam B. Patterning device (for example mask) MA and substrate W may be aligned using patterning device alignment marks M1, M2 and substrate alignment marks P1, P2.

The depicted apparatus may be used in at least one of the following modes:
1. In step mode, the support structure (for example, mask table) MT and the substrate table WT are kept essentially stationary, while an entire pattern imparted to the radiation beam is projected onto a target portion C at one time (that is, a single static exposure). The substrate table WT is then shifted in the X and/or Y direction so that a different target portion C can be exposed.
2. In scan mode, the support structure (for example, mask table) MT and the substrate table WT are scanned synchronously while a pattern imparted to the radiation beam is projected onto a target portion C (that is, a single dynamic exposure). The velocity and direction of the substrate table WT relative to the support structure (for example, mask table) MT may be determined by the (de-)magnification and image reversal characteristics of the projection system PS.
3. In another mode, the support structure (for example, mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 7B shows an implementation of the lithographic apparatus 700 in more detail, including the source collector module SO, the illumination system IL, and the projection system PS. The source collector module SO is constructed and arranged such that a vacuum environment can be maintained in an enclosing structure 720 of the source collector module SO. The systems IL and PS are likewise contained within vacuum environments of their own. An EUV radiation emitting plasma 2 may be formed by a laser produced LPP plasma source. The function of source collector module SO is to deliver EUV radiation beam 20 from the plasma 2 such that it is focused in a virtual source point. The virtual source point is commonly referred to as the intermediate focus (IF), and the source collector module is arranged such that the intermediate focus IF is located at or near an aperture 721 in the enclosing structure 720. The virtual source point IF is an image of the radiation emitting plasma 2.

From the aperture 721 at the intermediate focus IF, the radiation traverses the illumination system IL, which in this example includes a facetted field mirror device 22 and a facetted pupil mirror device 24. These devices form a so-called "fly's eye" illuminator, which is arranged to provide a desired angular distribution of the radiation beam 21, at the patterning device MA, as well as a desired uniformity of radiation intensity at the patterning device MA (as shown by reference 760). Upon reflection of the beam 21 at the patterning device MA, held by the support structure (mask table) MT, a patterned beam 26 is formed and the patterned beam 26 is imaged by the projection system PS via reflective elements 28, 30 onto a substrate W held by the substrate table WT. To expose a target portion C on substrate W, pulses of radiation are generated while substrate table WT and patterning device table MT perform synchronized movements to scan the pattern on patterning device MA through the slit of illumination.

Each system IL and PS is arranged within its own vacuum or near-vacuum environment, defined by enclosing structures similar to enclosing structure 720. More elements than shown may generally be present in illumination system IL and projection system PS. Further, there may be more mirrors present than those shown. For example there may be one to six additional reflective elements present in the illumination system IL and/or the projection system PS, besides those shown in FIG. 7B.

Considering source collector module SO in more detail, a laser energy source including a laser 723 is arranged to deposit laser energy 724 into a fuel that includes a target material. The target material may be any material that emits EUV radiation in a plasma state, such as xenon (Xe), tin (Sn), or lithium (Li). The plasma 2 is a highly ionized plasma with electron temperatures of several 10's of electron volts (eV). Higher energy EUV radiation may be generated with other fuel materials, for example, terbium (Tb) and gadolinium (Gd). The energetic radiation generated during de-excitation and recombination of these ions is emitted from the plasma, collected by a near-normal incidence collector 3 and focused on the aperture 721. The plasma 2 and the aperture 721 are located at first and second focal points of collector CO, respectively.

Although the collector 3 shown in FIG. 7B is a single curved mirror, the collector may take other forms. For example, the collector may be a Schwarzschild collector having two radiation collecting surfaces. In an embodiment, the collector may be a grazing incidence collector which comprises a plurality of substantially cylindrical reflectors nested within one another.

To deliver the fuel, which, for example, is liquid tin, a droplet generator 726 is arranged within the enclosure 720, arranged to fire a high frequency stream 728 of droplets towards the desired location of plasma 2. The droplet generator 726 may be the target formation structure 216 and/or a target formation apparatus formed from the actuator 132 and the capillary tube 114. In operation, laser energy 724 is delivered in a synchronism with the operation of droplet generator 726, to deliver impulses of radiation to turn each fuel droplet into a plasma 2. The frequency of delivery of droplets may be several kilohertz, for example 50 kHz. In practice, laser energy 724 is delivered in at least two pulses: a pre pulse with limited energy is delivered to the droplet before it reaches the plasma location, in order to vaporize the fuel material into a small cloud, and then a main pulse of laser energy 724 is delivered to the cloud at the desired location, to generate the plasma 2. A trap 730 is provided on the opposite side of the enclosing structure 720, to capture fuel that is not, for whatever reason, turned into plasma.

The droplet generator 726 comprises a reservoir 701 which contains the fuel liquid (for example, melted tin) and a filter 769 and a nozzle 702. The nozzle 702 is configured to eject droplets of the fuel liquid towards the plasma 2 formation location. The droplets of fuel liquid may be ejected from the nozzle 702 by a combination of pressure within the reservoir 701 and a vibration applied to the nozzle by a piezoelectric actuator (not shown).

As the skilled reader will know, reference axes X, Y, and Z may be defined for measuring and describing the geometry and behavior of the apparatus, its various components, and the radiation beams 20, 21, 26. At each part of the apparatus, a local reference frame of X, Y and Z axes may be defined. In the example of FIG. 7B, the Z axis broadly coincides with the direction optical axis O at a given point in the system, and is generally normal to the plane of a patterning device (reticle) MA and normal to the plane of substrate W. In the source collector module, the X axis coincides broadly with the direction of fuel stream 728, while the Y axis is orthogonal to that, pointing out of the page as indicated in FIG. 7B. On the other hand, in the vicinity of the support structure MT that holds the reticle MA, the X axis is generally transverse to a scanning direction aligned with the Y axis. For convenience, in this area of the schematic diagram FIG. 7B, the X axis points out of the page, again as marked. These designations are conventional in the art and will be adopted herein for convenience. In principle, any reference frame can be chosen to describe the apparatus and its behavior.

Numerous additional components used in the operation of the source collector module and the lithographic apparatus 500 as a whole are present in a typical apparatus, though not illustrated here. These include arrangements for reducing or mitigating the effects of contamination within the enclosed vacuum, for example to prevent deposits of fuel material damaging or impairing the performance of collector 3 and other optics. Other features present but not described in detail are all the sensors, controllers and actuators involved in controlling of the various components and sub-systems of the lithographic apparatus 700.

Referring to FIG. 8, an implementation of an LPP EUV light source 800 is shown. The light source 800 may be used as the source collector module SO in the lithographic apparatus 700. Furthermore, the optical source 105 of FIG. 1 may be part of the drive laser 815. The drive laser 815 may be used as the laser 723 (FIG. 7B).

The LPP EUV light source 800 is formed by irradiating a target mixture 814 at a plasma formation location 805 with an amplified light beam 810 that travels along a beam path toward the target mixture 814. The target material discussed with respect to FIG. 1 and the targets in the stream of targets 121 discussed with respect to FIG. 1 may be or include the target mixture 814. The plasma formation location 805 is within an interior 807 of a vacuum chamber 830. When the amplified light beam 810 strikes the target mixture 814, a target material within the target mixture 814 is converted into a plasma state that has an element with an emission line in the EUV range. The created plasma has certain characteristics that depend on the composition of the target material within the target mixture 814. These characteristics may include the wavelength of the EUV light produced by the plasma and the type and amount of debris released from the plasma.

The light source 800 includes a drive laser system 815 that produces the amplified light beam 810 due to a population inversion within the gain medium or mediums of the laser system 815. The light source 800 includes a beam delivery system between the laser system 815 and the plasma formation location 805, the beam delivery system including a beam transport system 820 and a focus assembly 822. The beam transport system 820 receives the amplified light beam 810 from the laser system 815, and steers and modifies the amplified light beam 810 as needed and outputs the amplified light beam 810 to the focus assembly 822. The focus assembly 822 receives the amplified light beam 810 and focuses the beam 810 to the plasma formation location 805.

In some implementations, the laser system 815 may include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 815 produces an amplified light beam 810 due to the population inversion in the gain media of the laser amplifiers even if there is no laser cavity. Moreover, the laser system 815 may produce an amplified light beam 810 that is a coherent laser beam if there is a laser cavity to provide enough feedback to the laser system 815. The term "amplified light beam" encompasses one or more of: light from the laser system 815 that is merely amplified but not necessarily a coherent laser oscillation and light from the laser system 815 that is amplified and is also a coherent laser oscillation.

The optical amplifiers in the laser system 815 may include as a gain medium a filling gas that includes $CO_2$ and may amplify light at a wavelength of between about 9100 and about 11000 nm, and in particular, at about 10600 nm, at a gain greater than or equal to 800 times. Suitable amplifiers and lasers for use in the laser system 815 may include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 40 kHz or more. The pulse repetition rate may be, for example, 50 kHz. The optical amplifiers in the laser system 815 may also include a cooling system such as water that may be used when operating the laser system 815 at higher powers.

The light source 800 includes a collector mirror 835 having an aperture 840 to allow the amplified light beam 810 to pass through and reach the plasma formation location 805. The collector mirror 835 may be, for example, an ellipsoidal mirror that has a primary focus at the plasma formation location 805 and a secondary focus at an intermediate location 845 (also called an intermediate focus) where the EUV light may be output from the light source 800 and may be input to, for example, an integrated circuit lithography tool (not shown). The light source 800 may also include an open-ended, hollow conical shroud 850 (for example, a gas cone) that tapers toward the plasma formation location 805 from the collector mirror 835 to reduce the amount of plasma-generated debris that enters the focus assembly 822 and/or the beam transport system 820 while allowing the amplified light beam 810 to reach the plasma formation location 805. For this purpose, a gas flow may be provided in the shroud that is directed toward the plasma formation location 805.

The light source 800 may also include a master controller 855 that is connected to a droplet position detection feedback system 856, a laser control system 857, and a beam control system 858. The light source 800 may include one or more target or droplet imagers 860 that provide an output indicative of the position of a droplet, for example, relative to the plasma formation location 805 and provide this output to the droplet position detection feedback system 856, which may, for example, compute a droplet position and trajectory from which a droplet position error may be computed either on a droplet by droplet basis or on average. The droplet position detection feedback system 856 thus provides the droplet position error as an input to the master controller 855. The master controller 855 may therefore provide a laser position, direction, and timing correction signal, for example, to the laser control system 857 that may be used, for example, to control the laser timing circuit and/or to the beam control system 858 to control an amplified light beam position and shaping of the beam transport system 820 to change the location and/or focal power of the beam focal spot within the chamber 830.

The supply system 825 includes a target material delivery control system 826 that is operable, in response to a signal from the master controller 855, for example, to modify the release point of the droplets as released by a target material supply apparatus 827 to correct for errors in the droplets arriving at the desired plasma formation location 805.

Additionally, the light source 800 may include light source detectors 865 and 870 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 865 generates a feedback signal for use by the master controller 855. The feedback signal may be, for example, indicative of the errors in parameters such as the timing and focus of the laser pulses to properly intercept the droplets in the right place and time for effective and efficient EUV light production.

The light source 800 may also include a guide laser 875 that may be used to align various sections of the light source 800 or to assist in steering the amplified light beam 810 to the plasma formation location 705. In connection with the guide laser 875, the light source 800 includes a metrology system 824 that is placed within the focus assembly 822 to sample a portion of light from the guide laser 875 and the amplified light beam 810. In other implementations, the metrology system 824 is placed within the beam transport system 820. The metrology system 824 may include an optical element that samples or re-directs a subset of the light, such optical element being made out of any material that may withstand the powers of the guide laser beam and the amplified light beam 810. A beam analysis system is formed from the metrology system 824 and the master controller 855 since the master controller 855 analyzes the sampled light from the guide laser 875 and uses this information to adjust components within the focus assembly 822 through the beam control system 858.

Thus, in summary, the light source 800 produces an amplified light beam 810 that is directed along the beam path to irradiate the target mixture 814 at the plasma formation location 805 to convert the target material within the mixture 814 into plasma that emits light in the EUV range. The amplified light beam 810 operates at a particular wavelength (that is also referred to as a drive laser wavelength) that is determined based on the design and properties of the laser system 815. Additionally, the amplified light beam 810 may be a laser beam when the target material provides enough feedback back into the laser system 815 to produce coherent laser light or if the drive laser system 815 includes suitable optical feedback to form a laser cavity.

Other aspects of the invention are set out in the following numbered clauses.

1. A target delivery system for an extreme ultraviolet (EUV) light source, the system comprising:
   a conduit comprising an orifice configured to fluidly couple to a reservoir;
   an actuator configured to mechanically couple to the conduit such that motion of the actuator is transferred to the conduit; and
   a control system coupled to the actuator, the control system being configured to:
   determine an indication of pressure applied to target material in the reservoir, and control the motion of the actuator based on the determined indication of applied pressure.
2. The target delivery system of clause 1, wherein the control system is further configured to compare the determined indication of applied pressure to a threshold value, and the control system being configured to control the motion of the actuator based on the determined indication of applied pressure comprises the control system being configured to control the motion of the actuator based on the comparison.
3. The target delivery system of clause 2, wherein the motion of the actuator produces a displacement in a wall of the conduit and an acoustic wave inside the conduit, and the threshold value is related to an amplitude of the acoustic wave.
4. The target delivery system of clause 3, wherein the control system being configured to control the actuator based on the comparison comprises the control system being configured to only cause the actuator to produce displacement in the conduit wall if the determined indication of applied pressure is greater than the threshold value.
5. The target delivery system of clause 4, wherein the threshold value comprises a threshold pressure between zero and an operating pressure, the operating pressure being an amount of pressure that is applied to the target material in the reservoir during operation of the EUV light source.
6. The target delivery system of clause 5, wherein the acoustic wave comprises a maximum amplitude, and the threshold pressure is defined by the maximum amplitude.
7. The target delivery system of clause 5, wherein the threshold pressure is selected in a range of 200 to 1000 pounds per square inch (PSI).
8. The target delivery system of clause 5, wherein the control system further comprises:
one or more electronic processors, and
a non-transient computer-readable storage medium coupled to the one or more electronic processors.
9. The target delivery system of clause 1, wherein the control system being configured to control the motion of the actuator based on the determined indication of applied pressure comprises the control system being configured to provide modulation signals to the actuator based on the determined applied pressure, the modulation signals being sufficient to cause the actuator to produce displacement in a wall of the conduit.
10. The target delivery system of clause 9, wherein the actuator comprises a piezo-electric modulator, and the modulation signals comprise electrical signals sufficient to cause a shape of the piezo-electric modulator to change.
11. The target delivery system of clause 1, wherein the control system further comprises
an electrical switch configured to be coupled to the actuator, and wherein
the electrical switch is configured to receive the indication of the applied pressure,
the electrical switch is configured to have a particular one of a plurality of possible states at a particular time,
the electrical switch allows modulation signals to reach the actuator in fewer than all of the plurality of states,
the particular state of the electrical switch at the particular time is determined by the received indication of the applied pressure, and
the control system being configured to determine the indication of pressure applied to the target material in the reservoir comprises the control system being configured to determine that the electrical switch is in the particular state.
12. The target delivery system of clause 11, wherein the indication of the applied pressure is received from a separate pressure switch that is coupled to the reservoir.
13. The target delivery system of clause 11, wherein the received indication of the applied pressure comprises an analog signal received directly from a pressure sensor.
14. The target delivery system of clause 11, wherein the received indication of the applied pressure comprises an electronic signal generated by instructions executed by an electronic processor.
15. The target delivery system of clause 1, wherein an interior surface of the conduit is configured to be exposed to the target material, and the interior surface is substantially defect-free to thereby reduce cavitation in the target material.
16. The target delivery system of clause 15, wherein at least a portion of the interior surface is firepolished.
17. The target delivery system of clause 1, wherein the control system being configured to determine an indication of pressure applied to the target material comprises the control system being configured to analyze an indication from a pressure sensor configured to measure the applied pressure.
18. A target delivery system for an extreme ultraviolet (EUV) light source, the system comprising:
a conduit comprising an orifice configured to fluidly couple to a reservoir;
an actuator configured to mechanically couple to the conduit such that motion of the actuator is transferred to the conduit;
a signal generator configured to provide modulation signals to the actuator, the modulation signals being sufficient to cause the actuator to move; and
a control system coupled to the actuator and the signal generator, the control system being configured to:
control one or more characteristics of the modulation signals to thereby control one or more characteristics of a motion of the actuator such that, in use, the orifice remains substantially free of material damage.
19. The target delivery system of clause 18, wherein the one or more characteristics comprises a frequency content of the modulation signals, and the control system is configured to control the frequency content of the modulation signals.
20. The target delivery system of clause 19, wherein the control system is configured to reduce an amplitude of components of the modulation signal that have a frequency below a frequency threshold.
21. The target delivery system of clause 19, wherein the mechanically coupled actuator and conduit form an actuator-conduit assembly, and the control system is configured to reduce an amplitude of components of the modulation signal that are at a frequency associated with eigenmodes of the actuator-conduit assembly or its harmonics and sub-harmonics.
22. The target delivery system of clause 18, wherein the one or more characteristics comprises an amplitude of the modulation signals, and the control system is configured to control the amplitude of the modulation signals.
23. The target delivery system of clause 22, wherein the control system is configured to maintain the amplitude of the modulation signals to below an amplitude limit.
24. The target delivery system of clause 23, wherein the amplitude limit comprises a peak-to-peak amplitude limit.
25. The target delivery system of clause 18, wherein the orifice remains substantially free of cracks.
26. The target delivery system of clause 18, wherein the orifice is defined by an end of the conduit.
27. The target delivery system of clause 18, wherein the conduit is coupled to a structure that defines the orifice.
28. A target delivery system for an extreme ultraviolet (EUV) light source, the system comprising:
a reservoir configured to hold a mixture comprising target material and inclusion particles;
a conduit comprising an orifice configured to fluidly couple to the reservoir;
an actuator configured to mechanically couple to the reservoir such that motion of the actuator is transferred to the reservoir; and
a control system coupled to the actuator, the control system being configured to:
control the motion of the actuator to thereby cause the inclusion particles in the mixture to move toward a surface of the mixture.

29. The target delivery system of clause 28, wherein the actuator comprises an ultrasonic actuator.

30. The target delivery system of clause 28, further comprising a gas delivery system configured to deliver a flowing gas across the surface of the mixture.

31. The target delivery system of clause 30, wherein the flowing gas comprises at least one component configured to react with the inclusion particles to thereby remove at least some of the inclusion particles from the surface.

32. The target delivery system of clause 31, wherein:
the target material comprises melted tin,
the inclusion particles comprise tin oxide particles, and
the flowing gas comprises hydrogen.

33. The target delivery system of clause 32, wherein the motion of the actuator is controlled such that cavitation is induced in the mixture, and the inclusion particles are moved toward the surface by bubbles formed by the cavitation around the particles.

34. The target delivery system of clause 28, wherein the target delivery system further comprising one or more filters between the reservoir and the orifice, the filters being configured to substantially prevent the inclusion particles from reaching the orifice.

35. The target delivery system of clause 28, wherein the inclusion particles have a diameter of 1 micrometer (µm) or less.

36. The target delivery system of clause 28, wherein the inclusion particles comprise tin oxide particles.

37. A method of operating a target supply system of an EUV light source, the method comprising:
determining one or more characteristics of the supply system; and
controlling an actuator, mechanically coupled to the supply system, based on the one or more determined characteristics such that an orifice of the supply system remains substantially free of material damage during operational use.

What is claimed is:

1. A target delivery system for an extreme ultraviolet (EUV) light source, the system comprising:
a conduit comprising an orifice configured to fluidly couple to a reservoir;
an actuator configured to mechanically couple to the conduit such that motion of the actuator is transferred to the conduit; and
a control system coupled to the actuator, the control system being configured to:
determine an indication of pressure applied to target material in the reservoir, and
control the motion of the actuator based on the determined indication of applied pressure.

2. The target delivery system of claim 1, wherein the control system is further configured to compare the determined indication of applied pressure to a threshold value, and the control system being configured to control the motion of the actuator based on the determined indication of applied pressure comprises the control system being configured to control the motion of the actuator based on the comparison.

3. The target delivery system of claim 2, wherein the motion of the actuator produces a displacement in a wall of the conduit and an acoustic wave inside the conduit, and the threshold value is related to an amplitude of the acoustic wave.

4. The target delivery system of claim 3, wherein the control system being configured to control the actuator based on the comparison comprises the control system being configured to only cause the actuator to produce displacement in the conduit wall if the determined indication of applied pressure is greater than the threshold value.

5. The target delivery system of claim 4, wherein the threshold value comprises a threshold pressure between zero and an operating pressure, the operating pressure being an amount of pressure that is applied to the target material in the reservoir during operation of the EUV light source.

6. The target delivery system of claim 5, wherein the acoustic wave comprises a maximum amplitude, and the threshold pressure is defined by the maximum amplitude.

7. The target delivery system of claim 5, wherein the threshold pressure is selected in a range of 200 to 1000 pounds per square inch (PSI).

8. The target delivery system of claim 1, wherein the control system being configured to control the motion of the actuator based on the determined indication of applied pressure comprises the control system being configured to provide modulation signals to the actuator based on the determined applied pressure, the modulation signals being sufficient to cause the actuator to produce displacement in a wall of the conduit.

9. The target delivery system of claim 8, wherein the actuator comprises a piezo-electric modulator, and the modulation signals comprise electrical signals sufficient to cause a shape of the piezo-electric modulator to change.

10. The target delivery system of claim 1, wherein the control system further comprises an electrical switch configured to be coupled to the actuator, and wherein
the electrical switch is configured to receive the indication of the applied pressure,
the electrical switch is configured to have a particular one of a plurality of possible states at a particular time,
the electrical switch allows modulation signals to reach the actuator in fewer than all of the plurality of states,
the particular state of the electrical switch at the particular time is determined by the received indication of the applied pressure, and
the control system being configured to determine the indication of pressure applied to the target material in the reservoir comprises the control system being configured to determine that the electrical switch is in the particular state.

11. The target delivery system of claim 10, wherein the indication of the applied pressure is received from a separate pressure switch that is coupled to the reservoir.

12. The target delivery system of claim 10, wherein the received indication of the applied pressure comprises an analog signal received directly from a pressure sensor or an electronic signal generated by instructions executed by an electronic processor.

13. The target delivery system of claim 1, wherein an interior surface of the conduit is configured to be exposed to the target material, and the interior surface is substantially defect-free to thereby reduce cavitation in the target material.

14. The target delivery system of claim 13, wherein at least a portion of the interior surface is firepolished.

15. The target delivery system of claim 1, wherein the control system being configured to determine an indication of pressure applied to the target material comprises the control system being configured to analyze an indication from a pressure sensor configured to measure the applied pressure.

16. The target delivery system of claim 1, further comprising:

a reservoir configured to hold a mixture comprising target material and inclusion particles;

wherein the control system is further configured to:
control the motion of the actuator to thereby cause the inclusion particles in the mixture to move toward a surface of the mixture.

17. The target delivery system of claim 16, wherein the actuator comprises an ultrasonic actuator.

18. The target delivery system of claim 16, further comprising a gas delivery system configured to deliver a flowing gas across the surface of the mixture, wherein the flowing gas comprises at least one component configured to react with the inclusion particles to thereby remove at least some of the inclusion particles from the surface.

19. The target delivery system of claim 18, wherein:
the target material comprises melted tin,
the inclusion particles comprise tin oxide particles, and
the flowing gas comprises hydrogen.

20. The target delivery system of claim 19, wherein the motion of the actuator is controlled such that cavitation is induced in the mixture, and the inclusion particles are moved toward the surface by bubbles formed by the cavitation around the particles.

21. The target delivery system of claim 16, wherein the target delivery system further comprising one or more filters between the reservoir and the orifice, the filters being configured to substantially prevent the inclusion particles from reaching the orifice.

22. The target delivery system of claim 16, wherein the inclusion particles have a diameter of 1 micrometer (μm) or less.

23. The target delivery system of claim 16, wherein the inclusion particles comprise tin oxide particles.

24. A method of operating a target supply system of an EUV light source, the method comprising:
determining an indication of pressure applied to a target material in a reservoir that is fluidly coupled to a conduit including an orifice; and
controlling the motion of an actuator, mechanically coupled to the conduit such that motion of the actuator is transferred to the conduit, based on the determined indication of applied pressure.

25. The method of claim 24, further comprising comparing the determined indication of applied pressure to a threshold value, wherein controlling the motion of the actuator comprises controlling the motion of the actuator based on the comparison.

26. The method of claim 25, wherein motion of the actuator produces a displacement in a wall of the conduit and an acoustic wave inside the conduit, and the threshold value is related to an amplitude of the acoustic wave.

27. The method of claim 24, wherein controlling the motion of the actuator comprises providing modulation signals to the actuator based on the determined applied pressure, the modulation signals being sufficient to cause the actuator to produce displacement in a wall of the conduit.

* * * * *